(12) United States Patent
Wu et al.

(10) Patent No.: US 9,882,609 B2
(45) Date of Patent: Jan. 30, 2018

(54) CONTACTLESS DATA COMMUNICATION USING IN-PLANE MAGNETIC FIELDS, AND RELATED SYSTEMS AND METHODS

(71) Applicant: QUALCOMM Incorporated, San Diego, CA (US)

(72) Inventors: Wenqing Wu, San Diego, CA (US); Senthil Kumar Govindaswamy, Bangalore (IN); Raghu Sagar Madala, San Diego, CA (US); Peiyuan Wang, San Diego, CA (US); Kendrick Hoy Leong Yuen, San Diego, CA (US); David Joseph Winston Hansquine, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/280,119

(22) Filed: Sep. 29, 2016

(65) Prior Publication Data
US 2017/0019153 A1 Jan. 19, 2017

Related U.S. Application Data

(62) Division of application No. 14/036,526, filed on Sep. 25, 2013.

(51) Int. Cl.
*H04B 5/00* (2006.01)
*G09G 3/20* (2006.01)
(Continued)

(52) U.S. Cl.
CPC ......... *H04B 5/0031* (2013.01); *G09G 3/2096* (2013.01); *H01L 27/22* (2013.01);
(Continued)

(58) Field of Classification Search
USPC .................. 455/41.1; 365/171, 173
See application file for complete search history.

(56) References Cited

U.S. PATENT DOCUMENTS 7,088,611 B2 8/2006 Braun
7,619,431 B2 11/2009 De Wilde et al.
(Continued)

FOREIGN PATENT DOCUMENTS

CN 201788291 U 4/2011
DE 102007009724 A1 9/2007

OTHER PUBLICATIONS

Invitation to Pay Additional Fees and Partial International Search for PCT/US2014/057176, dated Dec. 22, 2014, 7 pages.
(Continued)

*Primary Examiner* — Ganiyu A Hanidu
(74) *Attorney, Agent, or Firm* — W&T/Qualcomm

(57) ABSTRACT

Embodiments described herein are related to contactless data communication. Related systems and methods for contactless data communication are disclosed herein. For example, a magnetic field-based contactless transmitter is disclosed that includes a substrate, a pair of dipole coils disposed on the substrate, and a drive circuit electrically coupled to the pair of dipole coils. To transmit data to a magnetic tunnel junction (MTJ) receiver disposed on a second substrate, the drive circuit is configured to drive the pair of dipole coils so as to generate a magnetic field in-plane to the MTJ receiver. Data can be transmitted from the magnetic field-based contactless transmitter to the MTJ receiver using the magnetic field.

32 Claims, 16 Drawing Sheets

(51) Int. Cl.
  *H01L 43/08* (2006.01)
  *H01L 27/22* (2006.01)
  *H04W 4/00* (2009.01)

(52) U.S. Cl.
  CPC ........... *H01L 43/08* (2013.01); *H04B 5/0087* (2013.01); *H04W 4/008* (2013.01); *G09G 2370/16* (2013.01)

(56) References Cited

U.S. PATENT DOCUMENTS

| | | | |
|---|---|---|---|
| 8,204,703 | B2 | 6/2012 | Govil et al. |
| 8,482,968 | B2 | 7/2013 | Worledge |
| 2002/0177409 | A1 | 11/2002 | Raggam |
| 2003/0231077 | A1 | 12/2003 | Nuspl et al. |
| 2005/0018725 | A1 | 1/2005 | Nurmikko |
| 2005/0026307 | A1 | 2/2005 | Osipov et al. |
| 2007/0205748 | A1 | 9/2007 | Abou |
| 2008/0232479 | A1 | 9/2008 | Javerliac |
| 2009/0046501 | A1* | 2/2009 | Ranjan ............... G11C 11/15 365/171 |
| 2010/0067293 | A1* | 3/2010 | Yu ............... G11C 11/16 365/171 |
| 2010/0248623 | A1 | 9/2010 | Haratani et al. |
| 2011/0156798 | A1 | 6/2011 | Ide et al. |
| 2011/0171907 | A1 | 7/2011 | Jolivet |
| 2012/0033490 | A1* | 2/2012 | Rao ............... G11C 11/16 365/171 |
| 2012/0193736 | A1 | 8/2012 | Mather et al. |
| 2012/0281465 | A1 | 11/2012 | Agan et al. |
| 2013/0070522 | A1* | 3/2013 | Saida ............... G11C 11/16 365/173 |
| 2013/0193587 | A1 | 8/2013 | Chen et al. |
| 2014/0043891 | A1 | 2/2014 | Edelstein et al. |
| 2015/0084972 | A1 | 3/2015 | Wu et al. |

OTHER PUBLICATIONS

International Search Report and Written Opinion for Patent Application No. PCT/US2014/057176, dated May 4, 2015, 22 pages.
Second Written Opinion for PCT/US2014/057176, dated Oct. 20, 2015, 16 pages.
International Preliminary Report on Patentability for PCT/US2014/057176, dated Jan. 4, 2016, 50 pages.

* cited by examiner

CONTACTLESS DATA COMMUNICATION USING IN-PLANE MAGNETIC FIELDS, AND RELATED SYSTEMS AND METHODS

PRIORITY CLAIM

The present application claims is a division of and claims priority to U.S. patent application Ser. No. 14/036,526 filed on Sep. 25, 2013 and entitled "CONTACTLESS DATA COMMUNICATION USING IN-PLANE MAGNETIC FIELDS, AND RELATED SYSTEMS AND METHODS," the contents of which is incorporated herein by reference in its entirety.

BACKGROUND

I. Field of the Disclosure

The technology of the disclosure relates generally to systems and methods for contactless data communication.

II. Background

Portable electronic devices, such as mobile phones and tablets in particular, require data communication between internal circuits. For example, a portable electronic device may include data communication components for transferring data between an application processor and a display within the portable electronic device. It may be desirable for these data communication components to provide high data transfer rates between the application processor and the display at desired power consumption levels. Furthermore, since these data communication components consume space in the portable electronic device, it may also be desirable for the data communication components to have a compact form factor. Additionally, it may be desirable to lower costs and lead times required to manufacture and/or assemble portable electronic devices.

Wireline connectors are one type of data communication component employed in portable electronic devices to support data exchange between application processors and displays. FIG. 1 illustrates an example of a wireline connector 10 configured to transfer data between an application processor 12 and a display 14 of a portable electronic device 16. As illustrated in FIG. 1, the application processor 12 is provided on an application processor board 18. The wireline connector 10 includes a communication socket 20 coupled to the application processor 12 and mounted on the application processor board 18. Additionally, the display 14 and a display controller 22 are provided on a display board 24. The display controller 22 is operably associated with the display 14 to transfer data and/or implement instructions indicated by the data for operation of the display 14. Accordingly, the display board 24 includes a communication socket 26 coupled to the display controller 22 so that the display controller 22 can receive data. The wireline connector 10 allows for data to be communicated between the communication sockets 20, 26, and thus ultimately between the application processor 12, the display controller 22, and the display 14. In FIG. 1, the wireline connector 10 is an F-PCB connector with male ends that are coupled to the communication sockets 20, 26. The wireline connector 10 should facilitate a high data transfer rate for efficient display of data in the portable electronic device 16. However, the wireline connector 10 may be relatively large and consume a significant amount of space within the portable electronic device 16. More specifically, the wireline connector 10 is a relatively large component in relation to the size of the portable electronic device 16. The wireline connector 10 may also require manual assembly, thereby increasing manufacturing costs and assembly lead times.

Recently, various contactless connection techniques have been developed to save device space, reduce manufacturing costs, and improve assembly lead time. These contactless connection techniques include radio frequency (RF) wireless connection techniques and baseband wireless connection techniques.

In this regard, FIG. 2 illustrates one example of a wireless connector 28 that may be utilized in the portable electronic device 16 in FIG. 1 (as opposed to the wireline connector 10) to wirelessly transfer data between the application processor 12 and the display 14 of the portable electronic device 16. In FIG. 2, the wireless connector 28 employs wireless connection techniques such as RF wireless connection techniques or baseband wireless connection techniques. RF wireless connection techniques typically require longer communication ranges than baseband wireless connection techniques, since many RF wireless connection techniques operate using far-field electromagnetic propagation rather than near-field electromagnetic propagation. RF wireless connection techniques may also consume more power and have lower data transfer rate capabilities than baseband wireless connection techniques. High frequency carrier signals used in RF wireless connection techniques may cause high rates of power consumption in power amplification devices. Furthermore, RF wireless connection techniques may be more susceptible to noise and distortion, thereby resulting in lower rates of data transfer. Alternatively, the wireless connector 28 in FIG. 2 may implement baseband wireless connection techniques, which may be capable of Gigabits per second (Gbps) transfer rates, for example. However, conventional baseband wireless inter-chip communication employs techniques such as inductive coupling and/or transmission line coupling, leading to the drawbacks of relatively high power consumptions, low data rates, and very limited communication ranges.

SUMMARY OF THE DISCLOSURE

Embodiments described herein are related to contactless data communication using in-plane magnetic fields. For example, in-plane magnetic field strength (rather than a rate of strength change as in inductive coupling techniques) may be used to represent data and magnetic tunnel junctions (MTJs) may be used for magnetic field strength sensing (rather than using inductive coils for sensing the change rate of magnetic field strength in inductive coupling contactless communication techniques). Related systems and methods for contactless data communication using in-plane magnetic fields are disclosed herein. In certain embodiments disclosed herein, an in-plane magnetic field-based contactless transmitter is disclosed that includes a substrate, a pair of dipole coils disposed on the substrate, and a drive circuit electrically coupled to the pair of dipole coils. To transmit data to an MTJ receiver disposed on a second substrate, the drive circuit of the magnetic-field based contactless transmitter is configured to drive a first dipole coil of the pair of dipole coils in a first magnetic field and a second dipole coil in a second magnetic field or substantially opposite the first magnetic field. As such, the first magnetic field and the second magnetic field generate a magnetic field in-plane to the MTJ receiver. By driving the first dipole coil in the first magnetic field and the second dipole coil in the second magnetic field, data can be transmitted from the magnetic field-based contactless transmitter to the MTJ receiver for processing by downstream circuitry. Because the magnetic field transmitted by the magnetic-field based contactless transmitter is in-plane to the MTJ receiver, the transmitter can provide higher data transfer rates with directional and amplitude data multiplexing and may also communicate at baseband to conserve power. Furthermore, by generating the magnetic field in-plane to the MTJ receiver, the magnetic field-based contactless transmitter not only has an enhanced communication range, but is also capable of being disposed in a relatively compact arrangement with the MTJ receiver.

In another embodiment, another in-plane magnetic field-based contactless transmitter is disclosed. The in-plane magnetic field-based contactless transmitter includes means for generating a first magnetic field and a second magnetic field. Furthermore, the in-plane magnetic field-based contactless transmitter includes means for driving the first magnetic field and the second magnetic field so that the second magnetic field is substantially opposite the first magnetic field. As such, a magnetic field is generated in-plane to an MTJ receiver disposed on a substrate.

In another embodiment, an in-plane contactless method of transmitting data is disclosed. To implement the exemplary embodiment, a pair of dipole coils is provided. The pair of dipole coils is disposed on a substrate and includes a first dipole coil paired with a second dipole coil. Additionally, the first dipole coil is driven in a first magnetic field and the second dipole coil is driven in a second magnetic field substantially opposite the first magnetic field to generate a magnetic field in-plane to an MTJ receiver disposed on a second substrate.

In another embodiment, another in-plane magnetic field-based contactless transmitter is disclosed. The exemplary in-plane magnetic field-based contactless transmitter includes a first dipole coil, a second dipole coil, and a drive circuit. The first dipole coil and the second dipole coil are disposed relative to one another so as to produce a pair of antipodal magnetic dipoles. The drive circuit is operably associated with the first dipole coil and the second dipole coil. More specifically, the drive circuit is configured to drive the first dipole coil and the second dipole coil to generate the pair of antipodal magnetic dipoles. Furthermore, the drive circuit receives a logic input having a logical state and sets a magnetic polarity of each of the pair of antipodal magnetic dipoles in accordance with the logical state of the logic input.

To receive data through contactless data communication, embodiments of magnetic field-based contactless receivers (e.g., MTJ receivers) are also disclosed herein. In one embodiment, an in-plane magnetic field-based contactless receiver includes a substrate, an MTJ disposed in-plane to the substrate, and a sense circuit. The MTJ has a reference layer and a free layer. The reference layer of the MTJ defines a first easy axis in-plane to the substrate such that a first magnetization of the reference layer is oriented along the first easy axis. The free layer of the MTJ defines a second easy axis substantially orthogonal to the first easy axis and in-plane to the substrate. Since the second easy axis of the free layer is substantially orthogonal to the first easy axis of the reference layer, the power used to switch the free layer can be reduced. As such, the arrangement of the MTJ may give the MTJ high magnetic field sensitivity, thus allowing for less power to be used during transmission. More specifically, the free layer has a second magnetization switchable between being oriented in a first direction and a second direction relative to the second easy axis. A resistance of the MTJ is related to the magnetic orientation alignment between the magnetization of the free layer (which varies with the applied in-plane magnetic field) and the magnetization of the reference layer (which is fixed). More specifically, when the second magnetization of the free layer is oriented in the first direction, a resistance of the MTJ is provided in a first resistive state. The resistance of the MTJ is provided in a second resistive state when the second magnetization of the free layer is oriented in the second direction. The sense circuit of the magnetic field-based contactless receiver is configured to sense the resistance of the MTJ. Accordingly, data can be represented based on whether the resistance of the MTJ is in the first resistive state or the second resistive state.

In another embodiment, another in-plane magnetic field-based contactless receiver is disclosed. The exemplary in-plane magnetic field-based contactless receiver includes means for defining a first easy axis in-plane to a substrate such that a first magnetization is oriented along the first easy axis. In addition, the in-plane magnetic field-based contactless receiver includes means for defining a second easy axis substantially orthogonal to the first easy axis and in-plane to the substrate. As such, a second magnetization is provided by the means for defining the second easy axis. The second magnetization is switchable between being oriented in a first direction around the second easy axis to provide a resistance in a first resistive state and being oriented in a second direction around the second easy axis to provide the resistance in a second resistive state. The in-plane magnetic field-based contactless receiver further includes means for sensing the resistance.

In another embodiment, an in-plane contactless method of receive data is disclosed. To implement the exemplary embodiment, an MTJ disposed in-plane to a substrate and having a resistance is provided. The MTJ includes a reference layer and a free layer. The reference layer of the MTJ defines a first easy axis in-plane to the substrate such that a first magnetization of the reference layer is oriented along the first easy axis. The free layer defines a second easy axis substantially orthogonal to the first easy axis and in-plane to the substrate. To receive the data, a second magnetization of the free layer is oriented such that the second magnetization is oriented in a first direction around the second easy axis to provide the resistance of the MTJ in a first resistive state, or is oriented in a second direction around the second easy axis to provide the resistance of the MTJ in a second resistive state. The resistance of the MTJ is sensed to provide the data being received.

Embodiments of contactless communication devices that include exemplary magnetic field-based contactless transmitters and exemplary magnetic field-based contactless receivers to provide for contactless data communication are also disclosed herein. In one embodiment, the contactless communication device has an MTJ, a pair of coils configured to produce a pair of antipodal magnetic dipoles, and a drive circuit. The pair of coils is disposed relative to the MTJ such that the antipodal pair of magnetic dipoles generates a magnetic field in-plane to the MTJ. The drive circuit is configured drive the pair of coils to produce the pair of antipodal magnetic dipoles. To communicate data in a contactless manner, the drive circuit is further configured to adjust a magnetic field orientation of the magnetic field in-plane within the MTJ. In comparison to inductor coupling and other contactless communication techniques, the contactless communication devices do not have to provide edge modulation, can consume less power, and may also be more immune to noise.

In another embodiment, another contactless communication device is disclosed. The contactless communication device includes means for producing a pair of antipodal magnetic dipoles such that the pair of antipodal magnetic dipoles generates a magnetic field in-plane to an MTJ. To communicate data, the contactless communication device also includes means for adjusting a magnetic field orientation of the magnetic field.

In yet another embodiment, a method of contactless data communication is disclosed. To implement the exemplary embodiment, an MTJ is disposed in-plane to a substrate. A pair of antipodal magnetic dipoles is produced such that the pair of antipodal magnetic dipoles generates a magnetic field in-plane to the MTJ. To communicate data, a magnetic field orientation of the generated in-plane magnetic field is adjusted.

DETAILED DESCRIPTION

Figure 1:
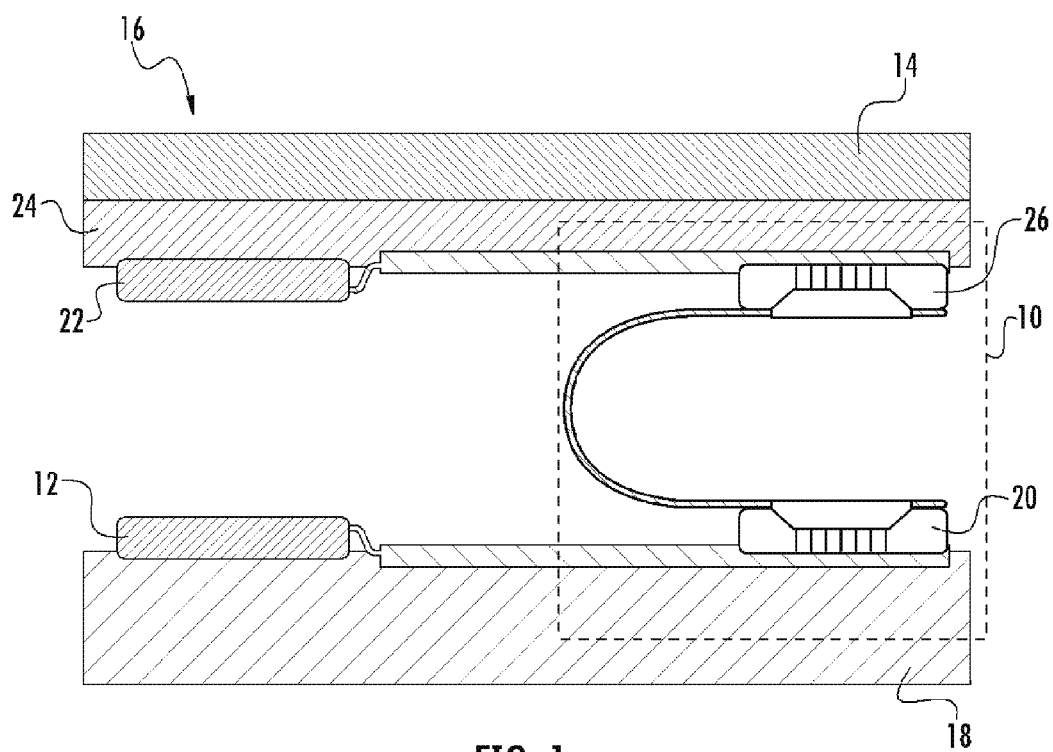
FIG. 1 illustrates an exemplary wireline connector from related art used in a portable electronic device.
Figure 2:
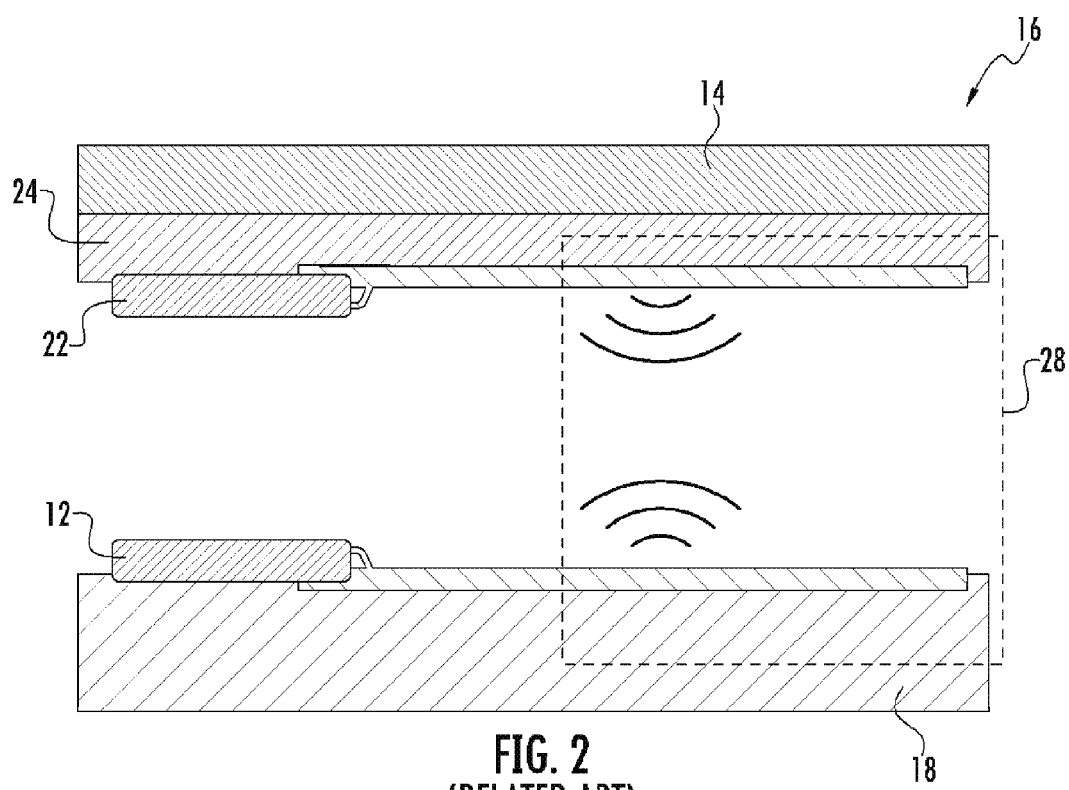
FIG. 2 illustrates a contactless data connector from related art used in the portable electronic device shown in FIG. 1.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments described herein are related to contactless data communication using in-plane magnetic fields. For example, in-plane magnetic field strength (rather than a rate of strength change as in inductive coupling techniques) may be used to represent data and magnetic tunnel junctions (MTJs) may be used for magnetic field strength sensing (rather than using inductive coils for sensing the change rate of magnetic field strength in inductive coupling contactless communication techniques). Related systems and methods for contactless data communication using in-plane magnetic fields are disclosed herein. In certain embodiments disclosed herein, an in-plane magnetic field-based contactless transmitter is disclosed that includes a substrate, a pair of dipole coils disposed on the substrate, and a drive circuit electrically coupled to the pair of dipole coils. To transmit data to an MTJ receiver disposed on a second substrate, the drive circuit of the magnetic-field based contactless transmitter is configured to drive a first dipole coil of the pair of dipole coils in a first magnetic field and a second dipole coil in a second magnetic field or substantially opposite the first magnetic field. As such, the first magnetic field and the second magnetic field generate a magnetic field in-plane to the MTJ receiver. By driving the first dipole coil in the first magnetic field and the second dipole coil in the second magnetic field, data can be transmitted from the magnetic field-based contactless transmitter to the MTJ receiver for processing by downstream circuitry. Because the magnetic field transmitted by the magnetic-field based contactless transmitter is in-plane to the MTJ receiver, the transmitter can provide higher data transfer rates with directional and amplitude data multiplexing and may also communicate at baseband to conserve power. Furthermore, by generating the magnetic field in-plane to the MTJ receiver, the magnetic field-based contactless transmitter not only has an enhanced communication range, but is also capable of being disposed in a relatively compact arrangement with the MTJ receiver.

In another embodiment, another in-plane magnetic field-based contactless transmitter is disclosed. The in-plane magnetic field-based contactless transmitter includes means for generating a first magnetic field and a second magnetic field. Furthermore, the in-plane magnetic field-based contactless transmitter includes means for driving the first magnetic field and the second magnetic field so that the second magnetic field is substantially opposite the first magnetic field. As such, a magnetic field is generated in-plane to an MTJ receiver disposed on a substrate.

In another embodiment, an in-plane contactless method of transmitting data is disclosed. To implement the exemplary embodiment, a pair of dipole coils is provided. The pair of dipole coils is disposed on a substrate and includes a first dipole coil paired with a second dipole coil. Additionally, the first dipole coil is driven in a first magnetic field and the second dipole coil is driven in a second magnetic field substantially opposite the first magnetic field to generate a magnetic field in-plane to an MTJ receiver disposed on a second substrate.

In another embodiment, another in-plane magnetic field-based contactless transmitter is disclosed. The exemplary in-plane magnetic field-based contactless transmitter includes a first dipole coil, a second dipole coil, and a drive circuit. The first dipole coil and the second dipole coil are disposed relative to one another so as to produce a pair of antipodal magnetic dipoles. The drive circuit is operably associated with the first dipole coil and the second dipole coil. More specifically, the drive circuit is configured to drive the first dipole coil and the second dipole coil to generate the pair of antipodal magnetic dipoles. Furthermore, the drive circuit receives a logic input having a logical state and sets a magnetic polarity of each of the pair of antipodal magnetic dipoles in accordance with the logical state of the logic input.

To receive data through contactless data communication, embodiments of magnetic field-based contactless receivers (e.g., MTJ receivers) are also disclosed herein. In one embodiment, an in-plane magnetic field-based contactless receiver includes a substrate, an MTJ disposed in-plane to the substrate, and a sense circuit. The MTJ has a reference layer and a free layer. The reference layer of the MTJ defines a first easy axis in-plane to the substrate such that a first magnetization of the reference layer is oriented along the first easy axis. The free layer of the MTJ defines a second easy axis substantially orthogonal to the first easy axis and in-plane to the substrate. Since the second easy axis of the free layer is substantially orthogonal to the first easy axis of the reference layer, the power used to switch the free layer can be reduced. As such, the arrangement of the MTJ may give the MTJ high magnetic field sensitivity, thus allowing for less power to be used during transmission. More specifically, the free layer has a second magnetization switchable between being oriented in a first direction and a second direction relative to the second easy axis. A resistance of the MTJ is related to the magnetic orientation alignment between the magnetization of the free layer (which varies with the applied in-plane magnetic field) and the magnetization of the reference layer (which is fixed). More specifically, when the second magnetization of the free layer is oriented in the first direction, a resistance of the MTJ is provided in a first resistive state. The resistance of the MTJ is provided in a second resistive state when the second magnetization of the free layer is oriented in the second direction. The sense circuit of the magnetic field-based contactless receiver is configured to sense the resistance of the MTJ. Accordingly, data can be represented based on whether the resistance of the MTJ is in the first resistive state or the second resistive state.

In another embodiment, another in-plane magnetic field-based contactless receiver is disclosed. The exemplary in-plane magnetic field-based contactless receiver includes means for defining a first easy axis in-plane to a substrate such that a first magnetization is oriented along the first easy axis. In addition, the in-plane magnetic field-based contactless receiver includes means for defining a second easy axis substantially orthogonal to the first easy axis and in-plane to the substrate. As such, a second magnetization is provided by the means for defining the second easy axis. The second magnetization is switchable between being oriented in a first direction around the second easy axis to provide a resistance in a first resistive state and being oriented in a second direction around the second easy axis to provide the resistance in a second resistive state. The in-plane magnetic field-based contactless receiver further includes means for sensing the resistance.

In another embodiment, an in-plane contactless method of receive data is disclosed. To implement the exemplary embodiment, an MTJ disposed in-plane to a substrate and having a resistance is provided. The MTJ includes a reference layer and a free layer. The reference layer of the MTJ defines a first easy axis in-plane to the substrate such that a first magnetization of the reference layer is oriented along the first easy axis. The free layer defines a second easy axis substantially orthogonal to the first easy axis and in-plane to the substrate. To receive the data, a second magnetization of the free layer is oriented such that the second magnetization is oriented in a first direction around the second easy axis to provide the resistance of the MTJ in a first resistive state, or is oriented in a second direction around the second easy axis to provide the resistance of the MTJ in a second resistive state. The resistance of the MTJ is sensed to provide the data being received.

Embodiments of contactless communication devices that include exemplary magnetic field-based contactless transmitters and exemplary magnetic field-based contactless receivers to provide for contactless data communication are also disclosed herein. In one embodiment, the contactless communication device has an MTJ, a pair of coils configured to produce a pair of antipodal magnetic dipoles, and a drive circuit. The pair of coils is disposed relative to the MTJ such that the antipodal pair of magnetic dipoles generates a magnetic field in-plane to the MTJ. The drive circuit is configured drive the pair of coils to produce the pair of antipodal magnetic dipoles. To communicate data in a contactless manner, the drive circuit is further configured to adjust a magnetic field orientation of the magnetic field in-plane within the MTJ. In comparison to inductor coupling and other contactless communication techniques, the contactless communication devices do not have to provide edge modulation, can consume less power, and may also be more immune to noise.

In another embodiment, another contactless communication device is disclosed. The contactless communication device includes means for producing a pair of antipodal magnetic dipoles such that the pair of antipodal magnetic dipoles generates a magnetic field in-plane to an MTJ. To communicate data, the contactless communication device also includes means for adjusting a magnetic field orientation of the magnetic field.

In yet another embodiment, a method of contactless data communication is disclosed. To implement the exemplary embodiment, an MTJ is disposed in-plane to a substrate. A pair of antipodal magnetic dipoles is produced such that the pair of antipodal magnetic dipoles generates a magnetic field in-plane to the MTJ. To communicate data, a magnetic field orientation of the generated in-plane magnetic field is adjusted.

Figure 3:
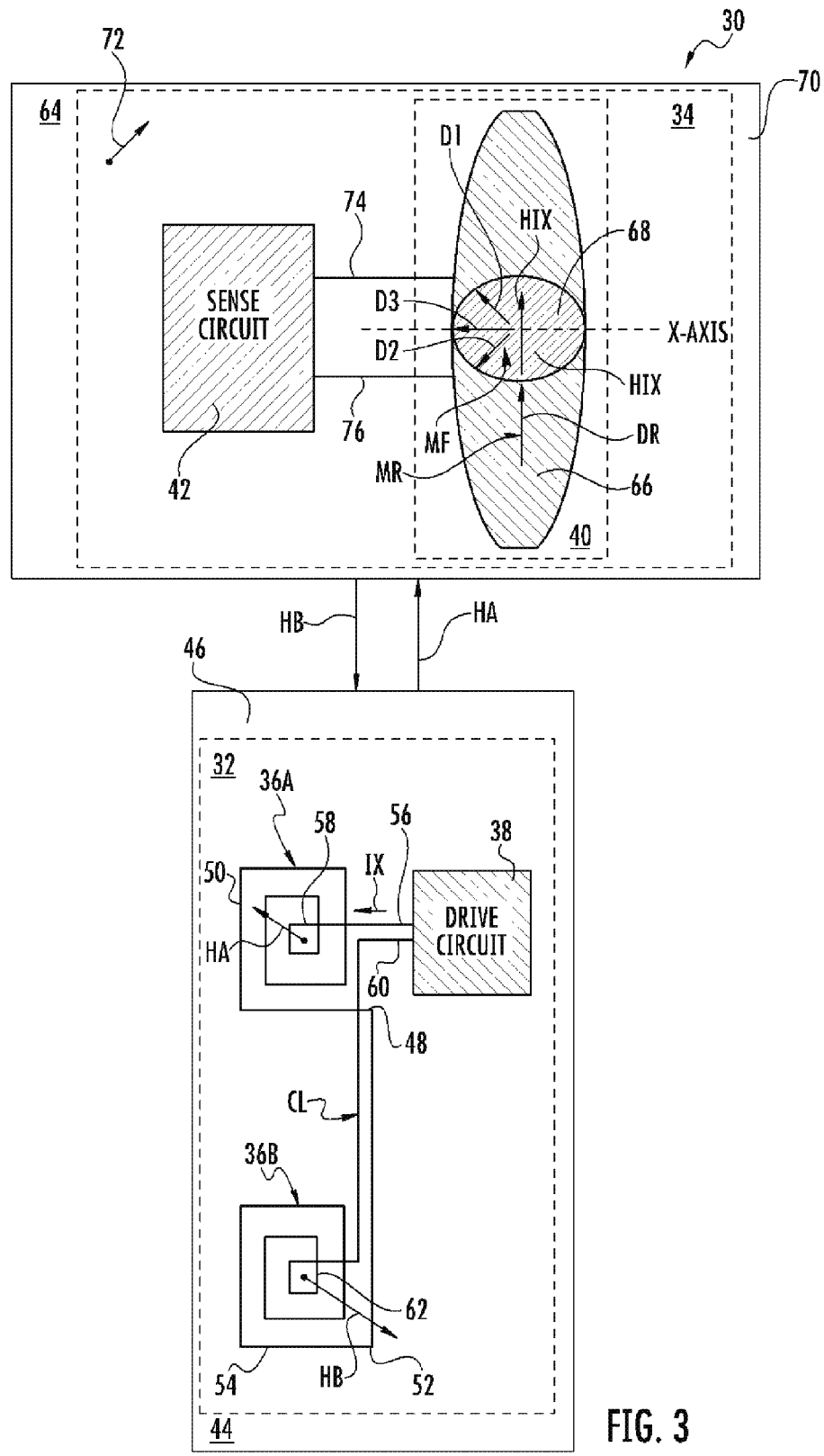
FIG. 3 is a system diagram of an exemplary contactless communication device that includes an exemplary magnetic field-based contactless transmitter and an exemplary a magnetic field-based contactless receiver to provide for contactless data communication.

In this regard, FIG. 3 is a system diagram of an exemplary in-plane contactless communication device 30. The contactless communication device 30 in this embodiment includes an in-plane magnetic field-based contactless transmitter 32 and an in-plane magnetic field-based contactless receiver 34 to provide for contactless data communication. The magnetic field-based contactless transmitter 32 of FIG. 3 includes a pair of dipole coils (referred to generically as elements "36" and specifically as elements 36A, 36B) and a drive circuit 38. The magnetic field-based contactless receiver 34 includes an MTJ 40 and a sense circuit 42. Since the magnetic field-based contactless receiver 34 employs the MTJ 40 to provide reception, the magnetic field-based contactless receiver 34 is an MTJ receiver. The magnetic field-based contactless transmitter 32 in FIG. 3 will first be described below. The magnetic field-based contactless receiver 34 in FIG. 3 will be described thereafter. As described in further detail below, a magnetic field HIX is generated in-plane to the magnetic field-based contactless receiver 34 by the magnetic field-based contactless transmitter 32 with the pair of dipole coils 36A, 36B. To transmit the different logical states of a logic input (e.g., a bit signal), a direction of the magnetic field HIX in-plane to the magnetic field-based contactless receiver 34 can be switched. This results in changes to the resistance of the MTJ 40 provided by the magnetic field-based contactless receiver 34. The resistance of the MTJ 40 can be sensed, and thus the logical state of the logic input can be determined and transmitted to downstream circuitry by the magnetic field-based contactless receiver 34.

In this regard, the magnetic field-based contactless transmitter 32 shown in FIG. 3 is provided on a substrate 44. More specifically, the pair of dipole coils 36 is disposed on the substrate 44 and the dipole coil 36A is paired with the dipole coil 36B. To pair the dipole coil 36A with the dipole coil 36B, the dipole coil 36A and the dipole coil 36B are disposed on the substrate 44 relative to one another so as to produce a pair of antipodal magnetic dipoles. More specifically, the dipole coil 36A generates one of the pair of antipodal magnetic dipoles and the dipole coil 36B generates another one of the pair of antipodal magnetic dipoles, wherein the pair of antipodal magnetic dipoles are oriented in opposing directions. In this embodiment, the dipole coil 36A and the dipole coil 36B are each disposed on a surface 46 of the substrate 44 so as to be formed along the same plane (i.e., the plane defined by the surface 46), but are wound along displaced axes normal to the plane (i.e., the surface 46). The pair of dipole coils 36 is also connected to one another so as to be part of a same current loop CL. For example, an external end 48 of an outermost winding 50 formed by the dipole coil 36A is connected to an external end 52 of an outermost winding 54 formed by the dipole coil 36B.

The drive circuit 38 is operably associated with the dipole coil 36A and the dipole coil 36B and is configured to drive the dipole coil 36A and the dipole coil 36B to produce the pair of antipodal magnetic dipoles. In this embodiment, the drive circuit 38 is electrically coupled to the pair of dipole coils 36 and is configured to drive the dipole coil 36A in a magnetic field HA and the dipole coil 36B in a magnetic field HB substantially opposite the magnetic field HA. More specifically, the drive circuit 38 is coupled to a connection end 56 that is connected to an innermost winding 58 formed by the dipole coil 36A and to a connection end 60 that is connected to an innermost winding 62 formed by the dipole coil 36B. The drive circuit 38 is configured to generate a voltage across the connection ends 56, 60 and produce a current IX across the pair of dipole coils 36. Since the external end 48 is connected to the outermost winding 50, the connection end 56 is connected to the innermost winding 58 and the connection end 60 is connected to the innermost winding 62, the current IX propagates in substantially opposite rotational directions around the pair of dipole coils 36. Accordingly, the magnetic field HA is generated by the dipole coil 36A so as to be substantially opposite the magnetic field HB generated by the dipole coil 36B. In this manner, the pair of dipole coils 36 is configured to generate a pair of antipodal magnetic dipoles wherein one of the dipole coils 36 generates one of the pair of antipodal magnetic dipoles so that it points out of the substrate 44 and the other dipole coil 36 generates another one of the pair of antipodal magnetic dipoles so that it points into the substrate 44. The pair of antipodal magnetic dipoles thus generates the magnetic field HIX in a middle area that is vertically and horizontally between the pair of antipodal magnetic dipoles.

It should be noted that the magnetic field HB can be (but does not have to be) perfectly opposite to the magnetic field HA. Whether the magnetic field HB is substantially opposite to the magnetic field HA should be determined in accordance to performance parameters for a particular communication application.

The drive circuit 38 is shown in FIG. 3 generating the current IX so that the current IX propagates from the connection end 56 to the connection end 60. More specifically, a voltage polarity of the voltage generated from the connection end 56 to the connection end 60 is positive. Thus, in FIG. 3, a pair of antipodal magnetic dipoles is configured such that the dipole coil 36A generates the one of the pair of antipodal magnetic dipoles so that it points out of the substrate 44, and the dipole coil 36B generates the other one of the pair of antipodal magnetic dipoles so that it points into the substrate 44. In this manner, the magnetic field HA is directed out of the page illustrating FIG. 3 while the magnetic field HB is directed into the page illustrating FIG. 3. However, the drive circuit 38 is configured to switch a current direction of the current IX such that the current IX can propagate to and from either of the connection ends 56, 60, and thus the drive circuit 38 is configured to switch the magnetic polarity of each of the pair of antipodal magnetic dipoles.

More specifically, the drive circuit 38 is configured to switch the voltage polarity of the voltage generated from the connection end 56 to the connection end 60, which thereby switches the current direction of the current IX, and thereby ultimately switches the magnetic polarity of each of the pair of antipodal magnetic dipoles. For example, the drive circuit 38 may switch the voltage polarity of the voltage generated from the connection end 56 to the connection end 60 to be negative. Accordingly, in this case, the current IX would propagate from the connection end 60 to the connection end 56. As a result, the magnetic polarity of each of the pair of antipodal magnetic dipoles would be such that the dipole coil 36A generates the one of the pair of antipodal magnetic dipoles so that it points into the substrate 44 and the dipole coil 36B generates the other one of the pair of antipodal magnetic dipoles so that it points out of the substrate 44. Therefore, the magnetic field HA would be directed into the page illustrating FIG. 3 while the magnetic field HB would be directed out the page illustrating FIG. 3. Thus, the magnetic fields HA, HB would remain substantially opposite to one another but would be produced in antipodal arrangements when the current direction of the current IX is switched by the drive circuit 38.

With continuing reference to FIG. 3, the pair of antipodal magnetic dipoles generated from the magnetic fields HA, HB can thus be used to communicate data in a contactless manner using the magnetic field-based contactless transmitter 32. The pair of dipole coils 36 of the magnetic field-based contactless transmitter 32 is disposed in-plane to the substrate 44 since the pair of dipole coils 36 is substantially in parallel with a plane defined by the stacked layers of the substrate 44. In this embodiment, the pair of dipole coils 36 is formed by a top metal layer on the surface 46 of the substrate 44, and thus is disposed substantially in parallel with the surface 46. As explained in further detail below, the magnetic fields HA, HB generate the magnetic field HIX in-plane to the magnetic field-based contactless receiver 34.

By switching the magnetic polarity of each of the pair of antipodal magnetic dipoles (and thus a direction of the magnetic field HIX), data can be communicated by the magnetic field-based contactless transmitter 32 to the magnetic field-based contactless receiver 34. For example, a logical state of a bit may be represented when the dipole coil 36A provides the one of the pair of antipodal magnetic dipoles so that it points out of the substrate 44 and the dipole coil 36B provides the other one of the pair of antipodal magnetic dipoles so that it points into the substrate 44), while the logical state having an antipodal bit value (e.g., a bit state having a bit value of logical "1") may be represented when the dipole coil 36A provides the one of the pair of antipodal magnetic dipoles so that it points into the substrate 44 and the dipole coil 36B provides the other one of the pair of antipodal magnetic dipoles so that it points out of the substrate 44. The pair of antipodal magnetic dipoles may also be used to represent logical states of information symbols, as explained in further detail below.

The drive circuit 38 is configured to drive the dipole coil 36A for generation of the magnetic field HA and the dipole coil 36B for generation of the magnetic field HB substantially opposite the magnetic field HA. Collectively, the magnetic field HA and the magnetic field HB generate the magnetic field HIX in-plane to the magnetic field-based contactless receiver 34 disposed on another substrate 64. As described above, the magnetic field-based contactless receiver 34 includes the MTJ 40 and is thus an MTJ receiver. It should be noted that FIG. 3 is a system diagram and is not intended to specifically illustrate a topographical arrangement between the magnetic field-based contactless transmitter 32 and the magnetic field-based contactless receiver 34. However, any suitable topographic arrangement may be utilized between the magnetic field-based contactless transmitter 32 and the magnetic field-based contactless receiver 34 and/or the substrate 44 and the substrate 64 such that the magnetic field HA and the magnetic field HB substantially opposite the magnetic field HA generate the magnetic field HIX in-plane to the magnetic field-based contactless receiver 34.

More detail regarding the magnetic field-based contactless receiver 34 will now be provided. The magnetic field HIX generated by the pair of dipole coils 36 of the magnetic field-based contactless transmitter 32 is in-plane to the MTJ 40 of the magnetic field-based contactless receiver 34, since the magnetic field HIX is substantially in parallel to a plane defined by the layers of the MTJ 40. Thus, the magnetic field HIX is directed substantially in parallel with the layers in the magnetic field-based contactless receiver 34.

The MTJ 40 may be any type of element with ferromagnetic materials and defining one or more tunneling barriers. A magnetization of at least one of the ferromagnetic materials can be adjusted. The MTJ 40 shown in FIG. 3 is disposed in-plane to the substrate 64, since the layers (including layers of ferromagnetic materials) of the MTJ 40 are in parallel with a plane defined by layers of the substrate 64. More specifically, the MTJ 40 is disposed in-plane to the substrate 64 and includes a reference layer 66 and a free layer 68. In this embodiment, the MTJ 40 is provided in-plane to the substrate 64 by being formed from layers of the substrate 64. As such, the reference layer 66 and the free layer 68 (and possibly any other layer of the MTJ 40) are included as layers of the substrate 64.

To communicate data from the magnetic field-based contactless transmitter 32 to the magnetic field-based contactless receiver 34, the drive circuit 38 of the magnetic field-based contactless transmitter 32 is configured to drive pair of dipole coils 36 to produce the pair of antipodal magnetic dipoles such that the pair of antipodal magnetic dipoles generates the magnetic field HIX in-plane to the free layer 68 of the MTJ 40 of the magnetic field-based contactless receiver 34. More specifically, the substrate 64 has a surface 70 where layers, such as the free layer 68 and the reference layer 66, of the substrate 64 are stacked so as to be parallel or substantially parallel to the surface 70. A direction 72 normal to the surface 70 is shown in FIG. 3, where terms describing topographical relationships in the substrate 64 such as "over" and "under" should be referenced with respect to the direction 72. The substrate 64 defines planes (e.g., the reference layer 66) where the direction 72 would also be normal to these planes. A field, such as the magnetic field HIX, is in-plane to the substrate 64 when the magnetic field is substantially orthogonal to the direction 72 on one of the planes defined by the substrate 64 that is normal to the direction 72. In particular, the magnetic field HIX is in-plane to the free layer 68 when the magnetic field HIX is substantially orthogonal to the direction 72 in a plane defined by the free layer 68, where the direction 72 is normal to the plane defined by the free layer 68. In this embodiment, the magnetic field HIX is produced in-plane to the free layer 68 and parallel to what shall be referred to as an X-axis of the substrate 64. Magnetic fields, such as the magnetic field HIX, do not have to be perfectly orthogonal to the direction 72 to be in-plane. Rather, whether the magnetic field (such as HIX) is substantially orthogonal to the direction 72 should be based on performance parameters and the like for an application using the magnetic field-based contactless receiver 34.

Referring again to FIG. 3, the MTJ 40 is formed by layers disposed on the substrate 64. In this embodiment, the reference layer 66 is formed beneath the free layer 68 with respect to the direction 72. The MTJ 40 shown in FIG. 3 is a spin-transfer torque (STT) MTJ 40. As such, the MTJ 40 has a resistance that is switchable to and from a first resistive state and a second resistive state. The reference layer 66 is provided as a magnetic layer and the free layer 68 is also provided as a magnetic layer. These magnetic layers are each made from one or more ferromagnetic materials. An electrical contact 74 is connected to the reference layer 66 to couple the reference layer 66 to the sense circuit 42. Similarly, an electrical contact 76 is connected to the free layer 68 to couple the free layer 68 to the sense circuit 42. A tunneling barrier is defined between the reference layer 66 and the free layer 68. In this embodiment, a dielectric layer (not shown) is provided between the reference layer 66 and the free layer 68 to define the tunneling barrier.

The reference layer 66 has a magnetization MR with a magnetic orientation. Similarly, the free layer 68 has a magnetization MF with a magnetic orientation that depends on the magnetic field HIX and whether the magnetic field HIX is generated for transmitting a logical "1" or a logical "0." Since the MTJ 40 in this embodiment is an STT MTJ, the free layer 68 is a free magnetic layer where the magnetic orientation of the magnetization MF is adjustable. For example, the free layer 68 is configured such that the magnetic orientation of the magnetization MF is adjustable from a first direction D1 to a second direction D2 and from the second direction D2 to the first direction D1. With regard to the reference layer 66, the reference layer 66 is configured such that the magnetic orientation of the magnetization MR is fixed in a reference direction DR. As a result, the MTJ 40 is switchable to and from a first magnetic orientation alignment state and a second magnetic orientation alignment state.

In the first magnetic orientation alignment state, the magnetic orientation of the magnetization MF of the free layer 68 is provided in the first direction D1. As such, the magnetization MF of the free layer 68 and the magnetization MR of the reference layer 66 have one magnetic orientation alignment with respect to one another, since the magnetization MR is fixed in the reference direction DR and the magnetization MF is provided in the first direction D1. The resistance of the MTJ 40 is thus provided in the first resistive state when the MTJ 40 is in the first magnetic orientation alignment state. For example, the resistance of the MTJ 40 may be approximately equal to resistance R1 when the MTJ 40 is in the first magnetic orientation alignment state.

In the second magnetic orientation alignment state, the magnetic orientation of the magnetization MF is rotated by the magnetic field HIX. More specifically, the magnetic orientation of the magnetization MF of the free layer 68 is provided in the second direction D2, which is rotated away from the first direction D1. As such, the magnetization MF of the free layer 68 and the magnetization MR of the reference layer 66 have another magnetic orientation alignment with respect to one another, since the magnetization MR is fixed in the reference direction DR and the magnetization MF is provided in the second direction D2. The magnetic orientation alignment in the second magnetic orientation alignment state is antipodal to the magnetic orientation alignment in the first magnetic orientation alignment state. As such, the resistance of the MTJ 40 is provided in the second resistive state when the MTJ 40 is in the second magnetic orientation alignment state. For example, the resistance of the MTJ 40 may be approximately equal to resistance R2 when the MTJ 40 is in the second magnetic orientation alignment state.

The in-plane magnetic field contactless communication between the magnetic field-based contactless transmitter 32 and the magnetic field-based contactless receiver 34 in FIG. 3 will now be discussed. With reference to FIG. 3, the MTJ 40 of the magnetic field-based contactless receiver 34 is configured such that the magnetic orientation state of the magnetization MF of the free layer 68 is set by a magnetic field orientation of the magnetic field HIX. Accordingly, the drive circuit 38 of the magnetic field-based contactless transmitter 32 is configured to adjust the magnetic field orientation of the magnetic field HIX in-plane within the MTJ 40. More specifically, the drive circuit 38 of the magnetic field-based contactless transmitter 32 is configured to set the magnetic field orientation of the magnetic field HIX in-plane within the free layer 68 in accordance with the magnetic polarity of each of the pair of antipodal magnetic dipoles. Thus, the free layer 68 is responsive to the magnetic field HIX to provide the MTJ 40 in the first magnetic orientation alignment state when the drive circuit 38 drives the pair of dipole coils 36 so that the magnetic field HA of the dipole coil 36A and the magnetic field HB of the dipole coil 36B are produced such that the dipole coil 36A provides the one of the pair of antipodal magnetic dipoles so that it points out of the substrate 44 and the dipole coil 36B provides the other one of the pair of antipodal magnetic dipoles so that it points into the substrate 44. In this case, the magnetic field orientation of the magnetic field HIX points upward, which together with magnetic anisotropy of the free layer 68 rotates the magnetization MF of the free layer 68 such that the magnetization MF is in the first direction D1 and the resistance of the MTJ 40 is provided in the first resistive state (i.e., approximately equal to resistance R1).

Similarly, the free layer 68 is responsive to the magnetic field HIX to provide the MTJ 40 in the second magnetic orientation alignment state when the drive circuit 38 drives the pair of dipole coils 36 so that the magnetic field HA of the dipole coil 36A and the magnetic field HB of the dipole coil 36B are produced such that the dipole coil 36A provides the one of the pair of antipodal magnetic dipoles so that it points into the substrate 44 and the dipole coil 36B provides the other one of the pair of antipodal magnetic dipoles so that it points out of the substrate 44. In this case, the magnetic field orientation of the magnetic field HIX points downward, which together with magnetic anisotropy of the free layer 68 rotates the magnetization MF of the free layer 68 such that the magnetization MF is in the second direction D2 and the resistance of the MTJ 40 is provided in the second resistive state (i.e., approximately equal to resistance R2). In this manner, the drive circuit 38 of the magnetic field-based contactless transmitter 32 is configured to adjust the magnetic field orientation of the magnetic field HIX in-plane within the free layer 68 of the magnetic field-based contactless receiver 34 by switching the magnetic polarity of each of the pair of antipodal magnetic dipoles.

With continuing reference to FIG. 3, the sense circuit 42 is configured to sense the resistance of the MTJ 40. Thus, the sense circuit 42 is operable to detect whether the MTJ 40 is in the first resistive state or the second resistive state. By detecting whether the MTJ 40 is in the first resistive state or the second resistive state, the sense circuit 42 is further configured to sense whether the magnetic orientation alignment of the MTJ 40 is in the first magnetic orientation alignment state (corresponding to the first resistive state) or the second magnetic orientation alignment state (corresponding to the first resistive state). Since the first magnetic orientation alignment state (and thus the first resistive state) and the second magnetic orientation alignment state (and thus the second resistive state) can be used to represent different logical states, the sense circuit 42 is configured to detect data communicated contactlessly from the magnetic field-based contactless transmitter 32 to the magnetic field-based contactless receiver 34.

Figure 4:
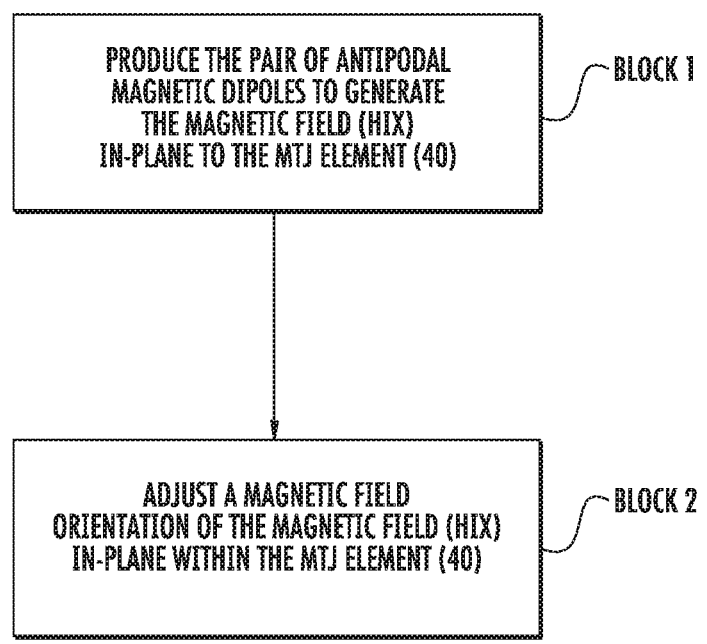
FIG. 4 is a flowchart illustrating an exemplary process for providing contactless data communication using the contactless communication device shown in FIG. 3.

Referring now to FIG. 3 and FIG. 4, FIG. 4 illustrates an exemplary process for contactless data communication between the magnetic field-based contactless transmitter 32 and the magnetic field-based contactless receiver 34 employing in-plane magnetic field contactless communication. In this regard, to communicate data in a contactless manner, the magnetic field-based contactless transmitter 32 produces the pair of antipodal magnetic dipoles such that the pair of antipodal magnetic dipoles generates the magnetic field HIX in-plane to the MTJ 40 (block 1 in FIG. 4). As described above, the drive circuit 38 of the magnetic field-based contactless transmitter 32 is configured to drive the pair of dipole coils 36 to produce the pair of antipodal magnetic dipoles by generating the current IX on the pair of dipole coils 36. As such, the drive circuit 38 drives the dipole coil 36A for producing the magnetic field HA and the dipole coil 36B for producing the magnetic field HB substantially opposite the magnetic field HA.

To communicate data, the magnetic field-based contactless transmitter 32 in FIG. 3 then adjusts the magnetic field orientation of the magnetic field HIX in-plane within the MTJ 40 (block 2 in FIG. 4). As described above, the magnetic field orientation of the magnetic field HIX sets the magnetic orientation of the magnetization MF of the free layer 68 within the MTJ 40. In this manner, the MTJ 40 is provided in either the first magnetic orientation alignment state (and thus the first resistive state), or the second magnetic orientation alignment state (and thus the second resistive state). The sense circuit 42 is then operable to detect whether the MTJ 40 is in the first resistive state (and thus the first magnetic orientation alignment state) or the second resistive state (and thus the second magnetic orientation alignment state). Since the first magnetic orientation alignment state (and thus the first resistive state) and the second magnetic orientation alignment state (and thus the second resistive state) can be used to represent different logical states, the sense circuit 42 is configured to detect data communicated contactlessly from the magnetic field-based contactless transmitter 32 to the magnetic field-based contactless receiver 34.

Figure 5:
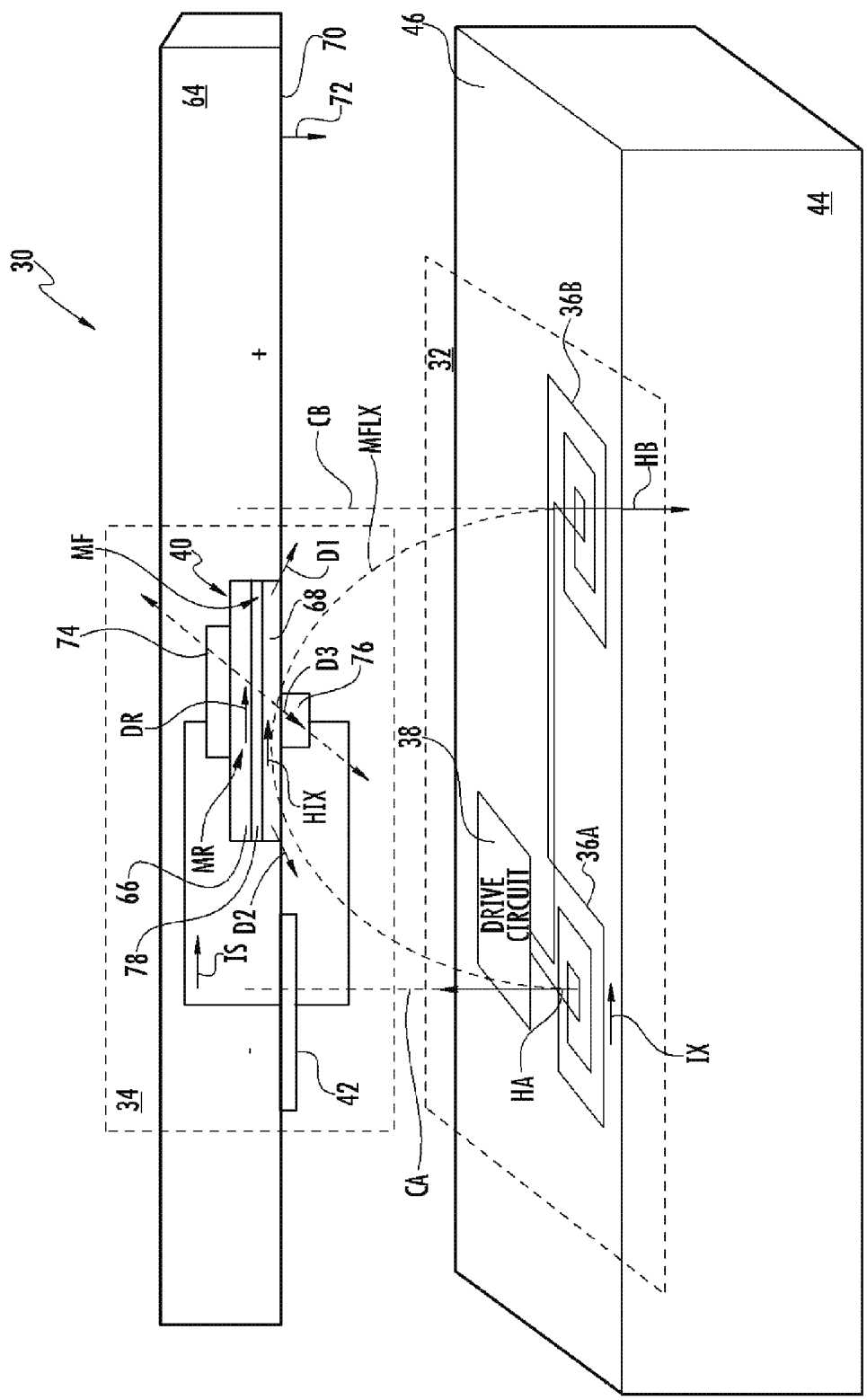
FIG. 5 is an exemplary cross-sectional view of the contactless communication device shown in FIG. 3 in an exemplary arrangement where the magnetic field-based contactless transmitter is provided so as to generate an in-plane magnetic field in the magnetic field-based contactless receiver.

FIG. 5 is an exemplary cross-sectional view of the contactless communication device 30 shown in FIG. 3 in an arrangement where the magnetic field-based contactless transmitter 32 is provided so as to generate the in-plane magnetic field HIX in the magnetic field-based contactless receiver 34. The cross-section view of FIG. 5 is taken orthogonally with respect to the X-axis (shown in FIG. 3) of the magnetic field-based contactless receiver 34. To arrange the magnetic field-based contactless transmitter 32 so that the in-plane magnetic field HIX is generated in-plane to the free layer 68 of the MTJ 40, the substrate 64 is disposed relative to the substrate 44 such that the surface 70 of the substrate 64 faces the surface 46 of the substrate 44. As such, the direction 72 normal to the surface 70 points toward the surface 46 of the substrate 44. In this embodiment, a plane defined by the pair of dipole coils 36 in the substrate 44 is substantially parallel to the plane defined by the free layer 68 in the substrate 64 that is normal to the direction 72. The dipole coil 36A is wound about a central axis CA and the dipole coil 36B is wound about a central axis CB. The central axis CA and the central axis CB extend out-of-plane from the substrate 44 and are substantially orthogonal to the plane defined by the pair of dipole coils 36. The central axis CA and the central axis CB shown in FIG. 5 are also substantially orthogonal to the surface 70 of the substrate 64.

As described above, the drive circuit 38 is configured to drive the dipole coil 36A for producing the magnetic field HA and the dipole coil 36B for producing the magnetic field HB substantially opposite the magnetic field HA, collectively generating the magnetic field HIX in-plane to the free layer 68 of the MTJ 40 disposed on a substrate 64. As a result, this produces the pair of antipodal magnetic dipoles and generates a magnetic field line MFLX that includes the magnetic fields HA, HB of the pair of dipole coils 36. The substrate 64 is positioned with respect to the substrate 44 so that the free layer 68 is horizontally positioned between the central axes CA, CB of the pair of dipole coils 36. The substrate 64 is also vertically positioned so that a maxima of the magnetic field line MFLX is provided in the free layer 68. In this manner, the magnetic field line MFLX generates the magnetic field HIX in-plane to the free layer 68. In this example, the pair of dipole coils 36 is positioned so that the central axes CA, CB intersect and are substantially orthogonal to the X-axis (shown in FIG. 3) of the substrate 64.

Note that a rotational direction of the magnetic field line MFLX is determined by the magnetic polarity of each of the pair of antipodal magnetic dipoles produced by the pair of dipole coils 36. When the drive circuit 38 drives the dipole coil 36A for producing the magnetic field HA such that the magnetic field HA is directed along the central axis CA toward the substrate 64 with the MTJ 40 and drives the dipole coil 36B for producing the magnetic field HB such that the magnetic field HB is directed along the central axis CB away from the substrate 64 with the MTJ 40, the magnetic field HIX is generated in-plane to the free layer 68 in a positive direction along the X-axis. The free layer 68 is responsive to the magnetic field HIX such that the magnetic orientation of the magnetization MF is aligned towards the magnetic field HIX. Accordingly, the drive circuit 38 is configured to set the magnetic field orientation of the magnetic field HIX in the positive direction along the X-axis when the drive circuit 38 sets the magnetic polarity of each of the pair of antipodal magnetic dipoles such that the dipole coil 36A provides the one of the pair of antipodal magnetic dipoles so that it points out of the substrate 44 and the dipole coil 36B provides the other one of the pair of antipodal magnetic dipoles so that it points into the substrate 44. As a result, the magnetic orientation of the magnetization MF is set in the first direction D1, which in this case is aligned toward the positive direction of the X-axis. The resistance of the MTJ 40 is thus provided in the first resistive state because the MTJ 40 is in the first magnetic orientation alignment state. Note that in FIG. 5, the magnetization MR of the reference layer 66 has the magnetic orientation in the direction DR, which extends out of the page.

With continuing reference to FIG. 5, when the drive circuit 38 drives the dipole coil 36A for producing the magnetic field HA such that the magnetic field HA is directed along the central axis CA away from the substrate 64 with the MTJ 40 and drives the dipole coil 36B for producing the magnetic field HB such that the magnetic field HB is directed along the central axis CB toward the substrate 64 with the MTJ 40, the magnetic field HIX is generated in-plane to the free layer 68 in a negative direction along the X-axis. As described above, the free layer 68 is responsive to the magnetic field HIX such that the magnetic orientation of the magnetization MF is aligned towards the magnetic field HIX. Accordingly, the drive circuit 38 is configured to set the magnetic field orientation of the magnetic field HIX in the negative direction along the X-axis when the drive circuit 38 sets the magnetic polarity of each of the pair of antipodal magnetic dipoles such that the dipole coil 36A provides the one of the pair of antipodal magnetic dipoles so that it points into the substrate 44 and the dipole coil 36B provides the other one of the pair of antipodal magnetic dipoles so that it points out of the substrate 44. As a result, the magnetic orientation of the magnetization MF is set in the second direction D2, which in this case is towards the negative direction along the X-axis. The resistance of the MTJ 40 is thus provided in the second resistive state because the MTJ 40 is in the second magnetic orientation alignment state. Note that in the view provided by FIG. 5, the rotational direction of the magnetic field line MFLX is clockwise when the magnetic field HIX is in the positive direction along the X-axis and is counterclockwise when the magnetic field HIX is in the negative direction along the X-axis.

With regard to the MTJ 40, the free layer 68 is formed to be at the surface 70 of the substrate 64. With respect to the direction 72, the reference layer 66 is provided in an interior of the substrate 64. A dielectric layer 78 is formed in the interior of the substrate 64 between the free layer 68 and the reference layer 66 to provide the tunnel barrier of the MTJ 40. The electrical contact 74 is coupled to the reference layer 66 and is connected to the sense circuit 42. The sense circuit 42 is configured to generate a sense current IS across the MTJ 40 by applying a voltage across the electrical contacts 74, 76. Since electrons are prevented from passing through the dielectric layer 78, the sense current IS (shown in FIG. 8) is a tunneling current created by quantum mechanical tunneling of electrons across the dielectric layer 78. Only electrons having a spin (either spin up or spin down) aligned with the magnetization MR of the reference layer 66 can quantum mechanically tunnel with higher probability from the free layer 68 to the reference layer 66. On the other hand, electrons with a substantially opposite spin (either spin down or spin up) can quantum mechanically reflect with higher probability from the reference layer 66 back to the free layer 68. As such, the sense current IS is actually composed of two currents: one for spin up electrons and one for spin down electrons. The MTJ 40 has a barrier energy, which is required in order for the electrons to rotate the magnetic orientation of the magnetization MF of the free layer 68.

In this embodiment, the sense circuit 42 generates the sense current IS to have a constant current magnitude. Typically, the MTJ 40 switches from the first resistive state to the second resistive state when the current level of the sense current IS reaches a critical switching current magnitude. However, in this embodiment, the magnetic field HIX is produced in-plane with the magnetic field orientation being substantially orthogonal to the magnetic orientation of the magnetization MF of the free layer 68. Note that the magnetic field orientation of the magnetic field HIX is substantially orthogonal regardless of whether the magnetic field orientation of the magnetic field HIX is directed in the positive or negative direction along the X-axis. In this manner, the TMR of the MTJ 40 can be varied by as much as 100% as the magnetic field orientation of the magnetic field HIX is switched to and from the positive or negative direction along the X-axis.

As such, the MTJ 40 is switched to and from the first magnetic orientation alignment state (corresponding to the first resistive state) and the second magnetic orientation alignment state (corresponding to the second resistive state) in response to the magnetic field orientation of the magnetic field HIX being switched to and from the positive and negative directions along the X-axis. Furthermore, this arrangement can significantly lower the barrier energy, thereby lowering the strength requirement of the magnetic field HIX, and thus lowering the amount of energy required for transmission. This allows for the current level of the current IS to be relatively low and for the MTJ 40 to be switched to and from the first magnetic orientation alignment state (corresponding to the first resistive state) and the second magnetic orientation alignment state (corresponding to the second resistive state). As such, the contactless communication device 30 may operate at relatively low power levels compared to other contactless communication systems from related art.

Figure 6:
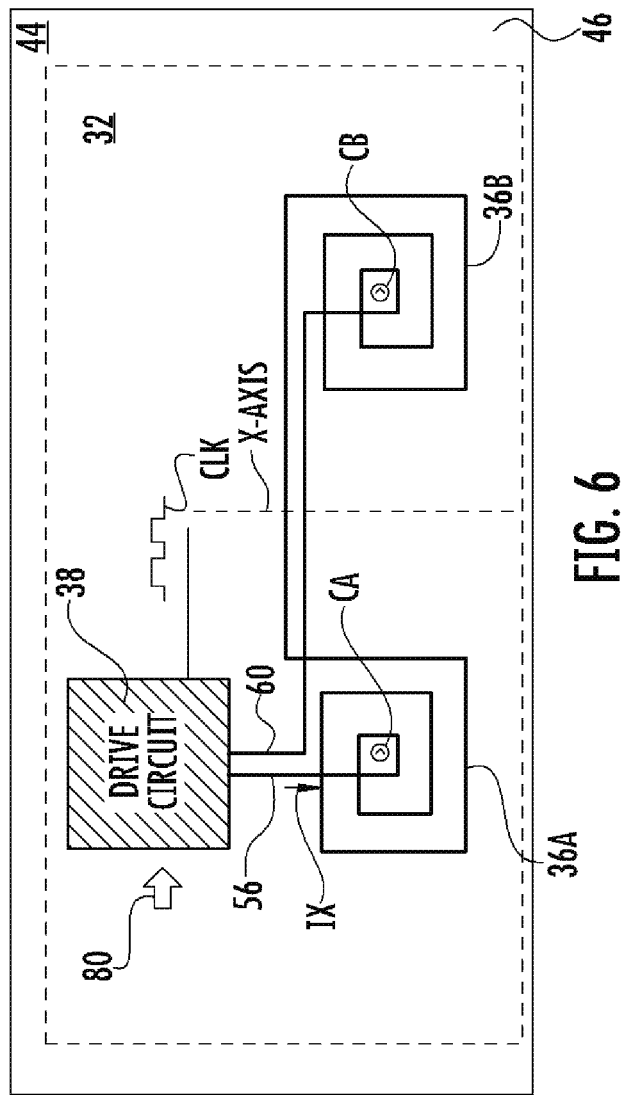
FIG. 6 is a top-down view of the magnetic field-based contactless transmitter shown in FIG. 3 formed on a substrate.

FIG. 6 is a top-down view of the magnetic field-based contactless transmitter 32 shown in FIG. 3 and FIG. 5 and formed on the substrate 44. The operation of the magnetic field-based contactless transmitter 32 with respect to a logic input 80 that has a logical state which represents data. As described above, the dipole coil 36A and the dipole coil 36B may each be disposed on the surface 46 of the substrate 44. As such, the plane defined by the pair of dipole coils 36 is the surface 46 in this example. The dipole coil 36A and the dipole coil 36B are thus disposed relative to one another so as to produce the pair of antipodal magnetic dipoles, as described above. Furthermore, the dipole coil 36A and the dipole coil 36B are positioned on the surface 46 of the substrate 44 such that the central axis CA of the dipole coil 36A and the central axis CB of the dipole coil 36B intersect and are substantially orthogonal to the X-axis of the MTJ 40 (shown in FIG. 3). The MTJ 40 is positioned along the X-axis so as to be between the dipole coil 36A and the dipole coil 36B. In this manner, the pair of dipole coils 36 are disposed relative to the MTJ 40 such that the pair of antipodal magnetic dipoles generate the magnetic field HIX (shown in FIG. 5) in-plane to the MTJ 40 within the free layer 68 (shown in FIG. 5).

As described above, the drive circuit 38 is operably associated with the dipole coil 36A and the dipole coil 36B, and is configured to drive the dipole coil 36A and the dipole coil 36B to generate the pair of antipodal magnetic dipoles. In FIG. 6, the drive circuit 38 is further configured to receive the logic input 80. The logic input 80 may include one or more logical signals. The logical state represented by the logic input 80 may be any type of logical state used to encode data. For example, the logical state may be one or more bit states, symbols, and/or the like. The drive circuit 38 may receive a clock signal CLK to coordinate transmission of the logical state provided by the logic input 80. The drive circuit 38 is configured so that the clock signal CLK times when the drive circuit 38 is opaque to the logic input 80 and when the drive circuit 38 is transparent to the logic input 80.

The drive circuit 38 is configured to set the magnetic polarity of each of the pair of antipodal magnetic dipoles produced by the pair of dipole coils 36 in accordance with the logical state of the logic input 80. For example, the logic input 80 may be a single bit signal and the logic state may be a bit state (i.e., may have bit values of either logical "1" or "0") of the bit signal. As mentioned above, the drive circuit 38 is configured to generate the current IX along the pair of dipole coils 36 by generating the voltage from the connection end 56 to the connection end 60. The drive circuit 38 sets the magnetic polarity of each of the pair of antipodal magnetic dipoles produced by the pair of dipole coils 36 by setting the voltage polarity of the voltage from the connection end 56 to the connection end 60. This is because the voltage polarity of the voltage from the connection end 56 to the connection end 60 determines the current direction of the current IX. The logical state (in this example, the bit state) of the logic input 80 thus corresponds to voltage polarity of the voltage, and thus to the current direction of the current IX. When the drive circuit 38 is transparent, the drive circuit 38 is responsive to the bit state of the logic input 80 such that the voltage polarity (and thus the current direction of the current IX) is set in accordance with the bit state.

For example, the bit state having a bit value of logical "1" may correspond to the voltage polarity of the voltage from the connection end 56 to the connection end 60 being positive and the current direction of the current IX being from the connection end 56 to the connection end 60. On the other hand, the bit state having a bit value of logical "0" may correspond to the voltage polarity of the voltage from the connection end 56 to the connection end 60 being negative and the current direction of the current IX being from the connection end 60 to the connection end 56. While the drive circuit 38 is transparent, and in response to the bit state of the logic input 80 having a bit value of logical "1," the drive circuit 38 may be configured to generate the voltage with the voltage polarity being positive and the current direction of the current IX being from the connection end 56 to the connection end 60. As such, the drive circuit 38 is configured to set the magnetic polarities of the pair of antipodal magnetic dipoles such that the dipole coil 36A generates the one of the pair of antipodal magnetic dipoles so that it points out of the substrate 44 and the dipole coil 36B generates the other one of the pair of antipodal magnetic dipoles so that it points into the substrate 44. Furthermore, while the drive circuit 38 is transparent, and in response to the bit state of the logic input 80 having a bit value of logical "0," the drive circuit 38 may be configured to generate the voltage with the voltage polarity being negative and the current direction of the current IX being from the connection end 60 to the connection end 56. As such, the drive circuit 38 is configured to set the magnetic polarities of the pair of antipodal magnetic dipoles such that the dipole coil 36A generates the one of the pair of antipodal magnetic dipoles so that it points into the substrate 44 and the dipole coil 36B generates the other one of the pair of antipodal magnetic dipoles so that it points out of the substrate 44.

The magnetic field-based contactless transmitter 32 shown in FIG. 6 is provided such that both the pair of dipole coils 36 and the drive circuit 38 are disposed on the substrate 44. For example, the substrate 44 may be a semiconductor substrate within an integrated circuit (IC) package. Thus, the pair of dipole coils 36 and the drive circuit 38 may each be formed in a front end of line (FEOL) of the IC package. When the substrate 44 is a semiconductor substrate, the substrate 44 has a substrate body formed from a wafer and/or doped layers of a suitable semiconductor material. For example, the semiconductor material may be Silicon (Si), Silicon Germanium (SiGe), Gallium Arsenide (GaAs), Indium Phosphorus (InP), and/or the like. Typical dopants that may be utilized to dope the semiconductor layers are Gallium (Ga), Arsenic (As), Silicon (Si), Tellurium (Te), Zinc (Zn), Sulfur (S), Boron (B), Phosphorus (P), Aluminum Gallium Arsenide (AlGaAs), Indium Gallium Arsenide (InGaAs), and/or the like. Furthermore, metallic layers may be formed on a top, within, and/or on a bottom of the substrate body to provide terminals, traces, contact pads, coils, connections, passive impedance elements, active semiconductor components, and/or the like. Also, any type of suitable semiconductor technology may be used to provide the topology of the substrate 44. For example, the semiconductor technology may be Complementary Metal-On-Oxide Semiconductor (CMOS) technology, BiComplementary Metal-On-Oxide Semiconductor (BiCMOS) technology, Silicon-On-Insulator (SOI) technology, and/or the like.

Alternatively, the pair of dipole coils 36 and the drive circuit 38 may be formed on separate substrates. For example, the pair of dipole coils 36 and the drive circuit 38 may still be provided in the same IC package. However, the drive circuit 38 may be formed in the FEOL of the IC package while the pair of dipole coils may be formed in a back end of line (BEOL) of the IC package. Thus, the drive circuit 38 may be formed on the semiconductor substrate in the FEOL of the IC package while the pair of dipole coils 36 is formed in an insulating substrate of the BEOL for the IC package. In another embodiment, the pair of dipole coils 36 and the drive circuit 38 may each be formed in different IC packages. In still another embodiment, the drive circuit 38 may be provided in an IC package while the pair of dipole coils 36 is formed on a printed circuit board. In yet another embodiment, the drive circuit 38 may be provided in an IC package that is mounted on a laminate of an electronic package. In this case, the pair of dipole coils 36 may be formed on the laminate of the electronic package and the electronic package may be mounted on a printed circuit board.

Figure 7:
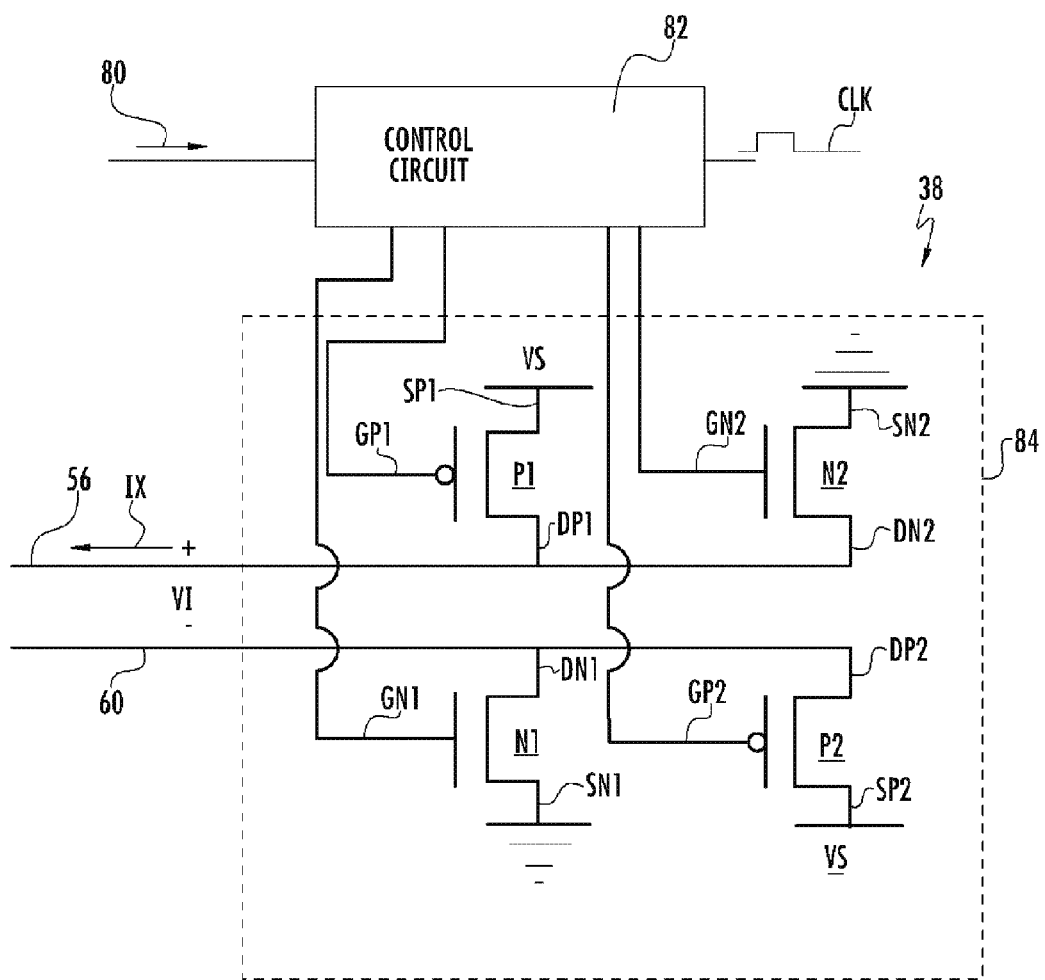
FIG. 7 illustrates one embodiment of an exemplary drive circuit, which may be provided in the magnetic field-based contactless transmitter shown in FIG. 6.

FIG. 7 illustrates one embodiment of the drive circuit 38, which may be provided in the magnetic field-based contactless transmitter 32 shown in FIG. 6. In this embodiment, the drive circuit 38 includes a control circuit 82 and a switching circuit 84. The switching circuit 84 is coupled to the connection end 56 and the connection end 60 and is configured to generate the voltage VI from the connection end 56 to the connection end 60, and thus to generate the current IX. The switching circuit 84 is further configured such that the voltage polarity of the voltage VI is switchable and thus such that the current direction of the current IX is switchable.

As shown in FIG. 7, the control circuit 82 is configured to receive the logic input 80, which in this example is the single bit signal described above, and to receive the clock signal CLK. While the control circuit 82 is transparent, and in response to the bit state of the logic input 80 having the bit value of logical "1," the control circuit 82 is configured to control the switching circuit 84 such that the switching circuit 84 generates the voltage VI with the voltage polarity being positive and the current direction of the current IX being from the connection end 56 to the connection end 60. While the control circuit 82 is transparent, and in response to the bit state of the logic input 80 having the bit value of logical "0," the control circuit 82 is configured to control the switching circuit 84 such that the switching circuit 84 generates the voltage VI with the voltage polarity being negative and the current direction of the current IX being from the connection end 60 to the connection end 56.

In this embodiment, the switching circuit 84 includes Field Effect Transistors (FETs) P1, N1, P2, N2. The FET P1 is a P-channel FET that includes a gate GP1 coupled to the control circuit 82, a source SP1 coupled to receive a supply voltage VS, and a drain DP1 coupled to the connection end 56. The FET N1 is an N-channel FET that includes a gate GN1 coupled to the control circuit 82, a source SN1 coupled to ground, and a drain DN1 coupled to the connection end 60. The FET P2 is a P-channel FET that includes a gate GP2 coupled to the control circuit 82, a source SP2 coupled to receive the supply voltage VS, and a drain DP2 coupled to the connection end 60. The FET N2 is an N-channel FET that includes a gate GN2 coupled to the control circuit 82, a source SN2 coupled to ground, and a drain DN2 coupled to the connection end 56.

While the control circuit 82 is transparent, and in response to the bit state of the logic input 80 having the bit value of logical "1," the control circuit 82 is configured to control the switching circuit 84 so that the FETs P1, N1 are turned on and the FETs P2, N2 are turned off. More specifically, the control circuit sets the gate GP1 and the gate GN2 to a low voltage and sets the gate GP2 and the gate GN1 to a high voltage. As a result, the switching circuit 84 generates the voltage VI with the voltage polarity being positive and the current direction of the current IX being from the connection end 56 to the connection end 60. While the control circuit 82 is transparent, and in response to the bit state of the logic input 80 having the bit value of logical "0," the control circuit 82 is configured to control the switching circuit 84 so that the FETs P2, N2 are turned on and the FETs P1, N1 are turned off. More specifically, the control circuit sets the gate GP1 and the gate GN2 to a high voltage and sets the gate GP2 and the gate GN1 to a low voltage. As a result, the switching circuit 84 generates the voltage VI with the voltage polarity being negative and the current direction of the current IX being from the connection end 60 to the connection end 56.

Figure 8:
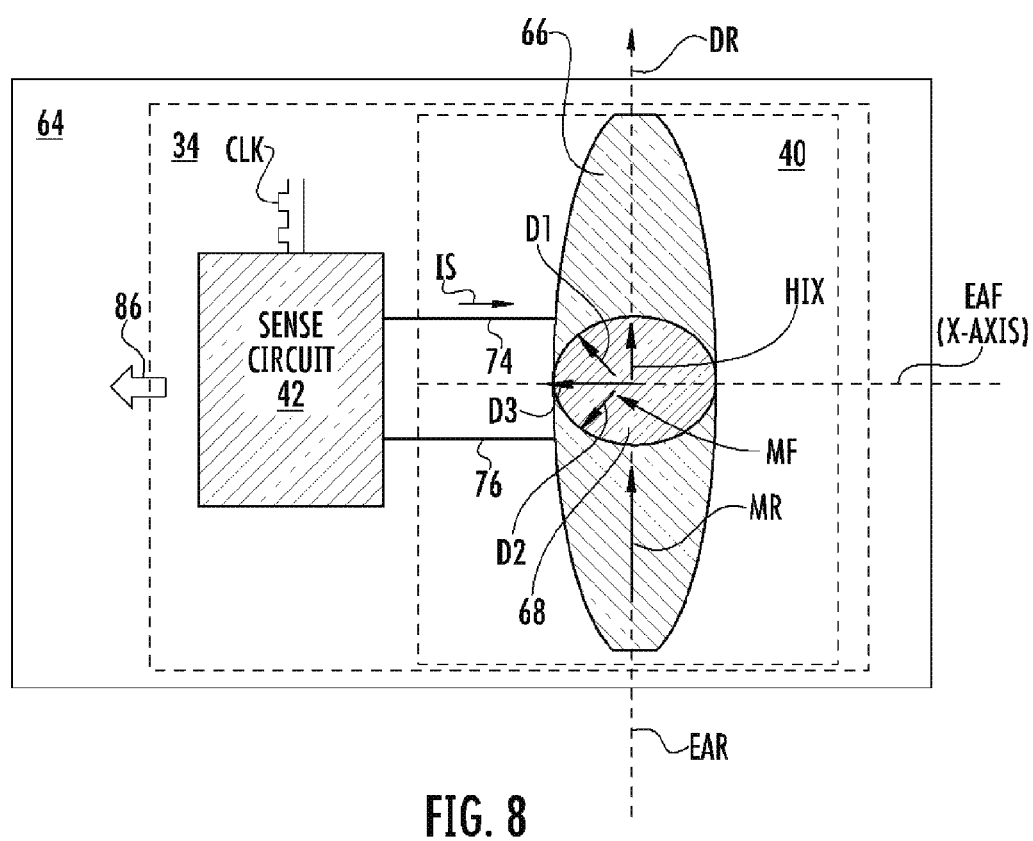
FIG. 8 is a top-down view of the magnetic field-based contactless receiver shown in FIG. 3 formed on a substrate.

In this regard, FIG. 8 is a top-down view of the magnetic field-based contactless receiver 34 shown in FIG. 3 and FIG. 5 formed on the substrate 64. In this regard, FIG. 8 describes additional details of the MTJ 40 and an operation of the magnetic field-based contactless receiver 34 with respect to a logic output 86 generated by the sense circuit 42. The MTJ 40 has an energy efficient arrangement. More specifically, the reference layer 66 of the MTJ 40 defines an easy axis EAR in-plane to the substrate such that a magnetization MR of the reference layer 66 is oriented along the easy axis EAR. The free layer 68 of the MTJ 40 defines an easy axis EAF (i.e., the X-axis) substantially orthogonal to the easy axis EAR and in-plane to the substrate 64. Since the easy axis EAF of the free layer 68 is substantially orthogonal to the easy axis EAR of the reference layer 66, the power needed to rotate the magnetization MF of the free layer 68 can be reduced. More specifically, under the in-plane magnetic field HIX from the magnetic field-based contactless transmitter 32, the free layer 68 has the magnetization MF switchable between being oriented in the first direction D1 and the second direction D2 around the easy axis EAF. When the magnetization MF is oriented in the first direction D1, the resistance of the MTJ 40 is provided in a first resistive state. The resistance of the MTJ 40 is provided in a second resistive state when the magnetization EAF is oriented in the second direction D2. Thus, data may be represented by the resistance of the MTJ 40. Additionally, a barrier energy of the MTJ 40 may be decreased by providing the easy axis EAF substantially orthogonal to the easy axis EAR, thereby reducing an amount of power required to switch the magnetization MF to and from the first direction D1 and the second direction D2. The sense circuit 42 of the magnetic field-based contactless receiver 34 is configured to sense the resistance of the MTJ 40. Accordingly, data can be represented based on whether the resistance of the MTJ 40 is in the first resistive state or the second resistive state.

As described above, the MTJ 40 is disposed in-plane to the substrate 64 and has the resistance that is switchable from the first resistive state to the second resistive state. The magnetic field HIX is produced in-plane, with the magnetic field orientation being substantially orthogonal to the orientation of the magnetization MF of the free layer 68. The reference layer 66 and the free layer 68 are each formed from ferromagnetic materials that are magnetically anisotropic. A ferromagnetic material that is magnetically anisotropic has an easy axis and a hard axis. The easy axis of the ferromagnetic material defines directions that are most energetically favorable for magnetization in the ferromagnetic material. The hard axis of the ferromagnetic material defines directions with energetic maximums for magnetization in the ferromagnetic material.

In this embodiment, the reference layer 66 is formed from a magnetocrystalline anisotropic crystal disposed on the substrate 64. Accordingly, the reference layer 66 defines the easy axis EAR in-plane to the substrate 64 such that the magnetization MR of the reference layer 66 is oriented along the easy axis EAR. The reference layer 66 is configured such that the magnetization MR of the reference layer 66 is fixed in the reference direction DR approximately along the easy axis EAR. In this embodiment, the reference layer 66 is elliptical and the easy axis EAR is provided along a major axis of the reference layer 66. The reference layer 66 is thus configured such that the easy axis EAR is provided in-plane to the reference layer 66 and the substrate 64. The reference layer 66 also defines a hard axis along a minor axis of the reference layer 66. As such, the reference layer 66 is further configured such that the hard axis is substantially orthogonal to the easy axis EAR and in-plane to the reference layer 66 and the substrate 64.

In this embodiment, the free layer 68 is also formed from a magnetocrystalline anisotropic crystal disposed on the substrate 64. To switch the resistance to and from the first resistive state and the second resistive state with the magnetic field HIX, the free layer 68 defines an easy axis EAF substantially orthogonal to the easy axis EAR of the reference layer 66 and in-plane to the free layer 68 and the substrate 64. In this example, the easy axis EAF defines the X-axis described above with regard to FIGS. 3, 5, and 6. The free layer 68 is configured such that the magnetization MF of the free layer 68 is switchable between being oriented in the first direction D1 around the easy axis EAF to provide the resistance of the MTJ 40 in the first resistive state and being oriented in the second direction D2 around the easy axis EAF to provide the resistance of the MTJ 40 in the second resistive state.

In this embodiment, the free layer 68 is also elliptical and the easy axis EAF is provided as a major axis of the free layer 68. The easy axis EAR of the reference layer 66 and the easy axis EAF of the free layer 68 are thus substantially orthogonal to one another. The free layer 68 defines a hard axis along the minor axis of the free layer 68. Thus, the free layer 68 is configured such that the hard axis of the free layer 68 is substantially orthogonal to the easy axis EAF and such that the hard axis of the free layer 68 is in-plane to the free layer 68 and the substrate 64. Furthermore, the hard axis of the reference layer 66 is provided so as to be parallel to the easy axis EAF of the free layer 68. In addition, the hard axis of the free layer 68 is provided so as to be parallel to the easy axis EAR of the reference layer 66. In this embodiment, a minor radius of the reference layer 66 is approximately equal to a major radius of the free layer 68. The MTJ 40 is formed such that the free layer 68 and the reference layer 66 are both substantially centered along the same out-of-plane axis of the substrate 64.

Given the arrangement of the MTJ 40 shown in FIG. 8, the magnetic tunneling conductivity of the MTJ 40 can be varied by as much as 100% as the magnetic field orientation of the magnetic field HIX is switched to and from the positive or negative direction along the easy axis EAF (i.e., the X-axis). Upon applying the magnetic field HIX to the free layer 68, an STT effect results in the injection of hole bands and/or spin current from the substrate 64 into the free layer 68 to adjust spin valence bands of the free layer 68 when the magnetic field orientation of the magnetic field HIX is switched to and from being substantially parallel to the reference direction DR and being antipodal to the reference direction DR (i.e., –DR). As such, the magnetic field orientation of the magnetic field HIX is substantially orthogonal to the easy axis EAF (i.e., the X-axis) when the magnetic field orientation of the magnetic field HIX is substantially parallel to the reference direction DR and when the magnetic field orientation of the magnetic field HIX is antipodal to the reference direction DR (i.e., –DR).

It should be noted that, in this embodiment, the magnetization MF of the free layer 68 is biased such that the magnetic orientation of the magnetization MF provided by the free layer 68 in a third direction D3 is substantially parallel to the easy axis EAF (i.e., the X-axis) and substantially orthogonal to the hard axis of the free layer 68 when the magnetic field HIX is absent. Thus, the third direction D3 is substantially orthogonal to the easy axis EAR of the reference layer 66. As a result, the MTJ 40 is provided in a third magnetic orientation alignment state and the resistance of the MTJ 40 is in a third resistive state when the drive circuit 38 (shown in FIG. 3) does not drive the pair of dipole coils 36 (shown in FIG. 3) to produce the pair of antipodal magnetic dipoles so that the magnetic field HIX is not generated. Thus, when the pair of antipodal magnetic dipoles and the magnetic field HIX are not provided, the MTJ 40 is in a third magnetic orientation alignment state having the magnetic orientation of the magnetization MF in the direction D3 along the easy axis EAF of the free layer 68 and the magnetic orientation MR of the reference layer 66 in the reference direction DR along the easy axis EAR of the reference layer 66.

The third direction D3 is along the easy axis EAF of the free layer 68 and is thus one of the minimum energy directions for magnetization of the free layer 68. As such, the torque from the magnetic field HIX needed to rotate the magnetization MF of the free layer 68 of the MTJ 40 is highest when the MTJ 40 is provided in the third magnetic orientation alignment state. The resistance of the MTJ 40 is approximately equal to resistance R3 in the third resistive state, which is higher than the resistance of the MTJ 40 in the first resistive state, and lower than the resistance of the MTJ 40 in the second resistive state. To switch the magnetic orientation of the magnetization MF provided by the free layer 68 around the easy axis EAF of the free layer 68, the drive circuit 38 generates the magnetic field HIX accordingly.

By providing the easy axis EAF and the easy axis EAR substantially orthogonal to each other and the magnetic field orientation of the magnetic field HIX substantially orthogonal to the easy axis EAF of the free layer 68, the magnetic field HIX results in an STT effect that injects hole bands and/or spin current from the substrate 64 into the free layer 68 to adjust spin valence bands of the free layer 68. In the presence of the in-plane magnetic field HIX substantially orthogonal to the easy axis EAF, the energy surfaces of the free layer 68 are distorted. Thus, the MTJ 40 can be implemented so less power is needed for operation, which also may lower power consumption of the sense circuit 42 and the magnetic field-based contactless transmitter 32 (shown in FIG. 6). Furthermore, to provide the resistance of the MTJ 40 in the third resistive state, the drive circuit 38 simply does not generate the magnetic field HIX.

As shown in FIG. 8, the sense circuit 42 is configured to detect data communicated contactlessly from the magnetic field-based contactless transmitter 32 (shown in FIG. 6) to the magnetic field-based contactless receiver 34 (shown in FIG. 3). More specifically, the sense circuit 42 is configured to sense the resistance of the MTJ 40. By detecting whether the MTJ 40 is in the first resistive state or the second resistive state, the sense circuit 42 is further configured to sense whether the magnetic orientation alignment of the MTJ 40 is in the first magnetic orientation alignment state (corresponding to the first resistive state) or the second magnetic orientation alignment state (corresponding to the first resistive state).

In FIG. 8, the sense circuit 42 is further configured to transmit a logic output 86 that represents a logical state based on the resistance of the MTJ 40. The logic output 86 may include one or more logical signals. The logical state represented by the logic output 86 may be any type of logical state used to encode data. For example, the logical state may be one or more bit states, symbols, and/or the like. In this embodiment, the sense circuit 42 receives the clock signal CLK to coordinate transmission of the logical state in the logic output 86. The sense circuit 42 is configured so that the clock signal CLK times when the sense circuit 42 is opaque to the resistance of the MTJ 40 and when the sense circuit 42 is transparent to the resistance of the MTJ 40.

When the sense circuit 42 is transparent, the sense circuit 42 is configured to set the logical state of the logic output 86 in accordance with the resistance of the MTJ 40, and thus in accordance with the magnetic orientation alignment of the MTJ 40. As such, the logical state of the logic output 86 corresponds to the logical state of the logic input 80 (shown in FIG. 6) received by the drive circuit 38 (shown in FIG. 6). However, the logical state of the logic output 86 may be delayed with respect to the logical state of the logic input 80, since the logical state of the logic output 86 may be provided in a different portion of a clock cycle of the clock signal CLK or in a different clock cycle of the clock signal CLK. Alternatively, a different independent clock signal, or a different clock signal based on the clock signal CLK, may be used with the sense circuit 42.

In this embodiment, the logic output 86 is a single bit signal and the logic state may be a bit state (i.e., with a bit value of either logical "1" or "0") of the bit signal. As mentioned above, the drive circuit 38 (shown in FIG. 6) is configured to generate the magnetic polarities of the pair of antipodal magnetic dipoles in accordance with the bit state of the logic input 80 (shown in FIG. 6). Accordingly, the magnetic field orientation of the magnetic field HIX is produced in accordance with the bit state of the logic input 80. The MTJ 40 is configured so that the resistance (and thus the magnetic orientation alignment) of the MTJ 40 is switched to and from the first resistive state (and thus the first magnetic orientation alignment state) and the second resistive state (and thus the second magnetic orientation alignment state) of the MTJ 40 in accordance with the magnetic field orientation of the magnetic field HIX. When the sense circuit 42 is transparent, the sense circuit 42 is responsive to the bit state of the logic input 80 such that the voltage polarity (and thus the current direction of a current IS) is set in accordance with the bit state. The resistance of the MTJ 40 and the magnetic orientation alignment of the MTJ 40 thus represent the bit state of the logic input 80 shown in FIG. 6.

Continuing with the example described above with regard to FIG. 6, while the drive circuit 38 (shown in FIG. 6) is transparent, and in response to the bit state of the logic input 80 having the bit value of logical "1," the drive circuit 38 (shown in FIG. 6) is configured to set the magnetic polarities of the pair of antipodal magnetic dipoles such that the dipole coil 36A (shown in FIG. 6) generates the one of the pair of antipodal magnetic dipoles so that it points out of the substrate 44 and the dipole coil 36B (shown in FIG. 6) generates the other one of the pair of antipodal magnetic dipoles so that it points into the substrate 44. As a result, the magnetic field HIX shown in FIG. 8 is generated in the free layer 68 such that the magnetic field orientation of the magnetic field HIX is substantially orthogonal to the easy axis EAF of the free layer 68 and substantially parallel to the direction DR. As a result of magnetic anisotropy and the applied magnetic field HIX from the magnetic field-based contactless transmitter 32 (shown in FIG. 6), the magnetic orientation of the magnetization MF of the free layer 68 is provided in the first direction D1 rotated upwards around the easy axis EAF of the free layer 68. Consequently, the resistance of the MTJ 40 is set in the first resistive state and the magnetic orientation alignment of the MTJ 40 is provided in the first magnetic orientation alignment state. Since the magnetic field orientation of the magnetic field HIX sets the magnetization MF of the free layer 68 in the first direction D1, the first resistive state of the resistance and the first magnetic orientation alignment state of the MTJ 40 correspond to the bit state having the bit value of logical "0." While the sense circuit 42 is transparent, and in response to the resistance being in the first resistive state and the MTJ 40 being in the first magnetic orientation alignment state, the sense circuit 42 is configured to generate the logic output 86 such that the bit state of the logic output 86 has the bit value of logical "0."

While the drive circuit 38 (shown in FIG. 6) is transparent, and in response to the bit state of the logic input 80 (shown in FIG. 6) having the bit value of logical "1," the drive circuit 38 is configured to set the magnetic polarity of each of the pair of antipodal magnetic dipoles such that the dipole coil 36A (shown in FIG. 6) generates the one of the pair of antipodal magnetic dipoles so that it points into the substrate 44 and the dipole coil 36B (shown in FIG. 6) generates the other one of the pair of antipodal magnetic dipoles so that it points out of the substrate 44. As a result, the magnetic field HIX shown in FIG. 8 is generated in the free layer 68 such that the magnetic field orientation of the magnetic field HIX is set to be substantially orthogonal to the easy axis EAF and antipodal to the direction DR. As a result of magnetic anisotropy and the applied magnetic field HIX, the magnetic orientation of the magnetization MF of the free layer 68 is provided in the first direction D1 by being rotated downwards around the easy axis EAF of the free layer 68. Consequently, the resistance of the MTJ 40 is set in the second resistive state and the magnetic orientation alignment of the MTJ 40 is provided in the second magnetic orientation alignment state. Since the magnetic field orientation of the magnetic field HIX is antipodal to the direction DR, the second resistive state of the resistance and the second magnetic orientation alignment state of the MTJ 40 correspond to the bit state of logical "1." While the sense circuit 42 is transparent, and in response to the resistance being in the second resistive state and the MTJ 40 being in the second magnetic orientation alignment state, the sense circuit 42 is configured to generate the logic output 86 such that the bit state of the logic output 86 has the bit value of logical "1." In this manner, data from the magnetic field-based contactless transmitter 32 (shown in FIG. 6) is transferred to the magnetic field-based contactless receiver 34 and may be used by circuitry downstream from the sense circuit 42. As explained in further detail below, some embodiments of the sense circuit 42 may further be operable to sense when the resistance is in the third resistive state and when the magnetic orientation alignment of the MTJ 40 is in the third magnetic orientation alignment state.

The magnetic field-based contactless receiver 34 shown in FIG. 8 is provided such that both the sense circuit 42 and the MTJ 40 are disposed on the substrate 64. For example, the substrate 64 may be a semiconductor substrate within an IC package, which may be the same as the IC package of the magnetic field-based contactless transmitter 32 (shown in FIG. 6) or a different IC package. The sense circuit 42 and the MTJ 40 may each be formed in a FEOL of the IC package. When the substrate 64 is a semiconductor substrate, the substrate 64 has a substrate body formed from a wafer and/or doped layers of a suitable semiconductor material. The semiconductor material may be any of the semiconductor materials described above with respect to the magnetic field-based contactless transmitter 32. Furthermore, metallic layers may be formed on a top, within, and/or on a bottom of the substrate body to provide terminals, traces, contact pads, coils, connections, passive impedance elements, active semiconductor components, and/or the like. Also, any type of suitable semiconductor technology may be used to provide the topology of the substrate 64 including any of the semiconductor technologies described above with respect to the magnetic field-based contactless transmitter 32. Alternatively, the sense circuit 42 and the MTJ 40 may be formed on separate substrates. In this case, the sense circuit 42 and the MTJ 40 may each be formed in different IC packages that are coupled on a printed circuit board.

Figure 9:
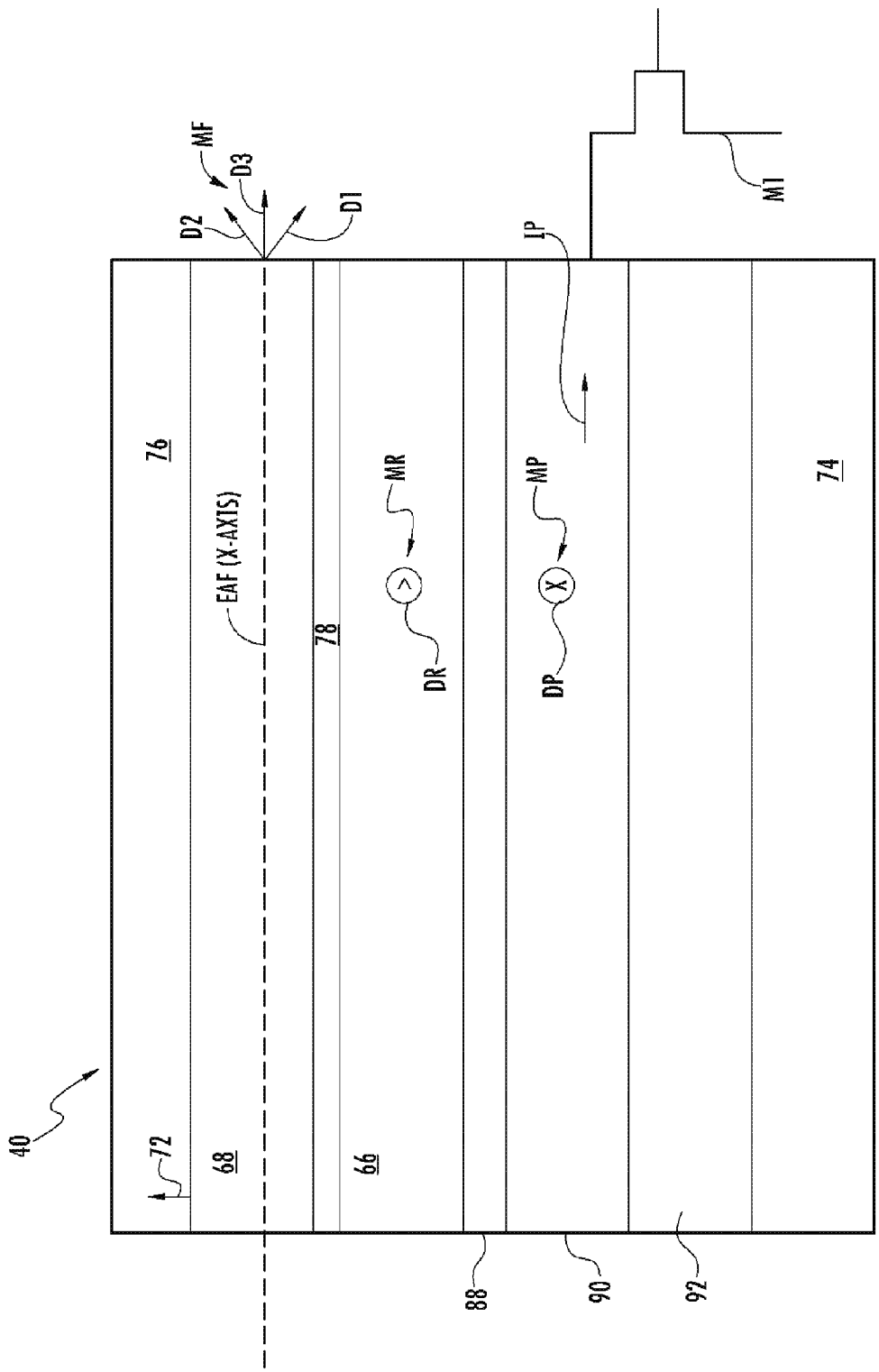
FIG. 9 illustrates a cross-sectional view of an exemplary magnetic tunnel junction (MTJ) element that includes a free layer, a reference layer, and other related layers, wherein the MTJ may be used in the magnetic field-based contactless receiver shown in FIG. 8.

FIG. 9 illustrates a cross-sectional view of one embodiment of the MTJ 40 in the magnetic field-based contactless receiver 34 shown in FIGS. 3 and 5. The cross-sectional view illustrates a stack of various layers, which may be utilized to provide the MTJ 40. The MTJ 40 shown in FIG. 9 includes the reference layer 66, the free layer 68, and the dielectric layer 78 that provides a tunnel barrier between the free layer 68 and the reference layer 66. Again, relative topological terms should be referenced with respect to the direction 72 described above with regard to FIG. 5. The cross-section of the MTJ 40 in FIG. 9 is taken along the easy axis EAF (i.e., the X-axis) of the free layer 68. The electrical contact 76 is coupled to the sense circuit 42 (shown in FIG. 8) and is formed from a metallic layer on and over the free layer 68. The easy axis EAR (not shown) of the reference layer 66 is in-plane and substantially orthogonal to the easy axis EAF, with the reference direction DR of the magnetization MR provided by the reference layer 66 coming out of the page.

In this embodiment, the MTJ 40 further comprises a barrier layer 88, a pinning layer 90, and an antiferromagnetic layer 92. The electrical contact 74 is coupled to the sense circuit 42 and is formed on and beneath the antiferromagnetic layer 92. The barrier layer 88, the pinning layer 90, and the antiferromagnetic layer 92 are provided to provide a magnetically rigid component so that the reference direction DR of the magnetization MR provided by the reference layer 66 is fixed and provided along the easy axis EAR (not shown). The barrier layer 88 is formed on and beneath the reference layer 66, while the pinning layer 90 is formed on and beneath the barrier layer 88. In this manner, the barrier layer 88 is provided between the pinning layer 90 and the reference layer 66. The MTJ 40 is configured to generate a pinning current IP across the pinning layer 90 so that the magnetization MR of the reference layer 66 is fixed in the reference direction DR. More specifically, the pinning current IP provides a magnetic field with a magnetic field orientation that provides the pinning layer 90 with a magnetization MP fixed in a direction DP. Since the barrier layer is between the pinning layer 90 and the reference layer 66, the pinning current IP is generated in-plane to the pinning layer 90 and parallel to the easy axis EAR (not shown) of the reference layer 66. The direction DP, however, is substantially opposite the reference direction DR. Accordingly, the magnetic field generated by the pinning current IP further provides the magnetization MR in the reference direction DR. A FET M1 may be provided in the MTJ 40 to generate the pinning current IP. The antiferromagnetic layer 92 helps secure the magnetization MP of the pinning layer 90. In one embodiment, a permanent ferromagnetic magnet (not shown) may be used to bias the magnetization MF of the free layer 68 in the third direction D3.

Figure 10:
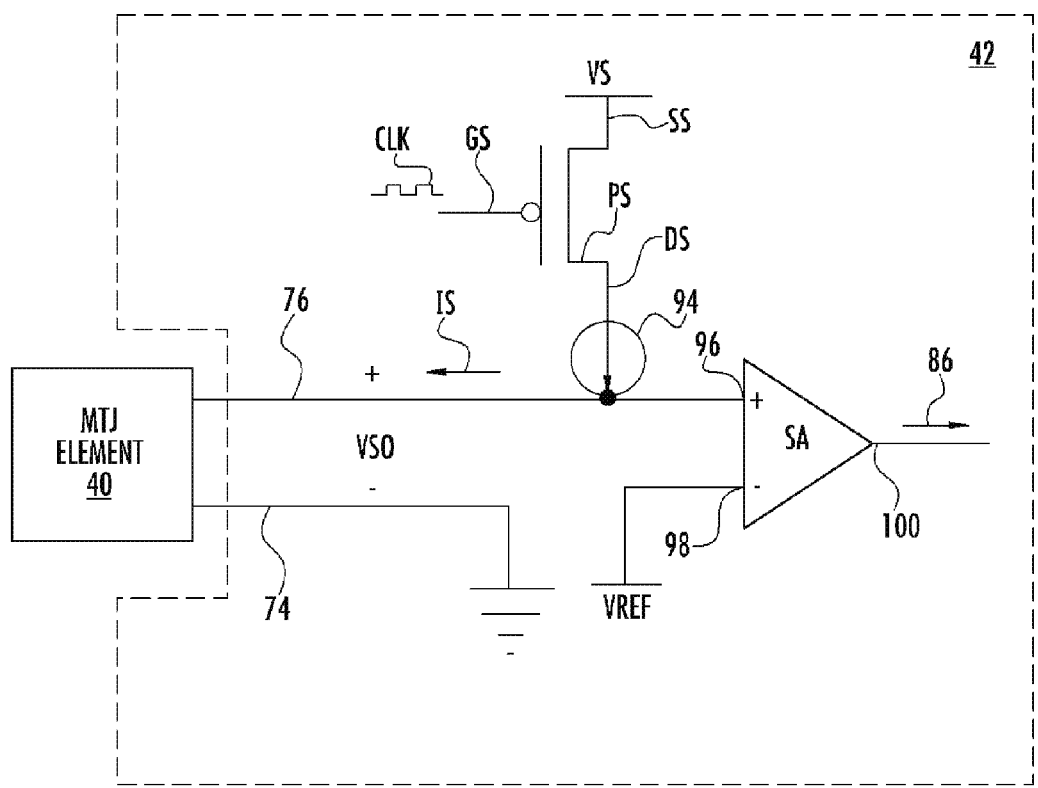
FIG. 10 illustrates one embodiment of a sense circuit, which may be used in the magnetic field-based contactless receiver shown in FIG. 8.

FIG. 10 illustrates one embodiment of the sense circuit 42, which may be used in the magnetic field-based contactless receiver 34 shown in FIG. 8. In this embodiment, the sense circuit 42 includes a FET PS, a current source 94, and a sense amplifier SA. The FET PS is a P-channel FET that includes a gate GS coupled to receive the clock signal CLK, a source SS coupled to receive the supply voltage VS, and a drain DS coupled to the current source 94. The current source 94 is configured to generate the sense current IS. However, since the current source 94 is coupled to the drain DS of the FET PS, the FET PS is configured to activate and deactivate the current source 94. More specifically, the current source 94 is activated so as to generate the sense current IS when the FET PS is turned on and the sense circuit 42 is transparent. The current source 94 is deactivated so as not to generate the sense current IS when the FET PS is turned off and the sense circuit 42 is opaque. Since the gate GS of the FET PS is coupled to receive the clock signal CLK, the sense circuit 42 is switched between being opaque and transparent in accordance with the clock signal CLK.

The sense circuit 42 is configured to sense the resistance and the magnetic orientation alignment of the MTJ 40. To sense the resistance and the magnetic orientation alignment of the MTJ 40, the sense amplifier SA is configured to sense a sense voltage VSO from the electrical contact 76 to the electrical contact 74. The sense voltage VSO is generated by the sense current IS. In this embodiment, the sense amplifier SA has a first input terminal 96, a second input terminal 98, and an output terminal 100. For example, the sense amplifier SA may be provided as an op-amp wherein the first input terminal 96 is a non-inverting input terminal while the second input terminal 98 is an inverting terminal. The logic output 86 is generated by the sense amplifier SA from the output terminal 100. To sense the sense voltage VSO from the electrical contact 76 to the electrical contact 74, the current source 94 and the first input terminal 96 are both coupled to the electrical contact 76, which as described above is coupled to the free layer 68 (shown in FIG. 8). The electrical contact 74 is coupled to the reference layer 66 (shown in FIG. 8) to provide the sense current IS with a path to ground. The second input terminal 98 of the sense amplifier SA is coupled to receive a reference voltage VREF.

In this embodiment, it is presumed that the resistance of the MTJ 40 is lower in the first resistive state (and thus the first magnetic orientation alignment state) than in the second resistive state (and thus the second magnetic orientation alignment state). Thus, when the resistance is approximately equal to resistance R1, the resistance is lower than when the resistance is approximately equal to resistance R2. While the sense circuit 42 is transparent, and in response to the resistance of the MTJ 40 being in the first resistive state (and the magnetic orientation alignment being in the first magnetic orientation alignment state), the sense current IS results in the sense voltage VSO having a first voltage level at the first input terminal 96. The first voltage level of the sense voltage VSO is provided so as to be greater than a reference voltage level of the reference voltage VREF. As a result, the logic output 86, which in this example is a bit signal, is generated so as to have a bit state with the bit value of logical "0". In this example, the logic output 86 has the bit state with the bit value of logical "0" by having a voltage level that is lower than the reference voltage level of the reference voltage VREF. The sense circuit 42 is thus configured to sense the resistance and the magnetic orientation alignment of the MTJ 40.

While the sense circuit 42 is transparent, and in response to the resistance of the MTJ 40 being in the second resistive state (and the magnetic orientation alignment being in the second magnetic orientation alignment state), the sense current IS results in the sense voltage VSO having a second voltage level at the first input terminal 96. The second voltage level of the sense voltage VSO is provided so as to be higher than the reference voltage level of the reference voltage VREF. As a result, the logic output 86, which in this example is the bit signal, is generated so as to have the bit state with the bit value of logical "1." In this example, the logic output 86 has the bit state with the bit value of logical "1" by having a voltage level that is higher than the reference voltage level of the reference voltage VREF. Thus, the sense circuit 42 is configured to sense the resistance and the magnetic orientation alignment of the MTJ 40 by generating the logic output 86 with a logical state (in this example, the bit state) set in accordance with the resistance and the magnetic orientation alignment of the MTJ 40.

Referring again to FIG. 6 and FIG. 8, the exemplary operation of the magnetic field-based contactless transmitter 32 and the magnetic field-based contactless receiver 34 described above thus allows for one bit state to be communicated from the magnetic field-based contactless transmitter 32 to the magnetic field-based contactless receiver 34 during a communication cycle. However, it may be desirable to communicate a logical state with multiple bits simultaneously. For example, it may be desirable to transmit bit symbols representing multiple bit states simultaneously.

Figure 11:
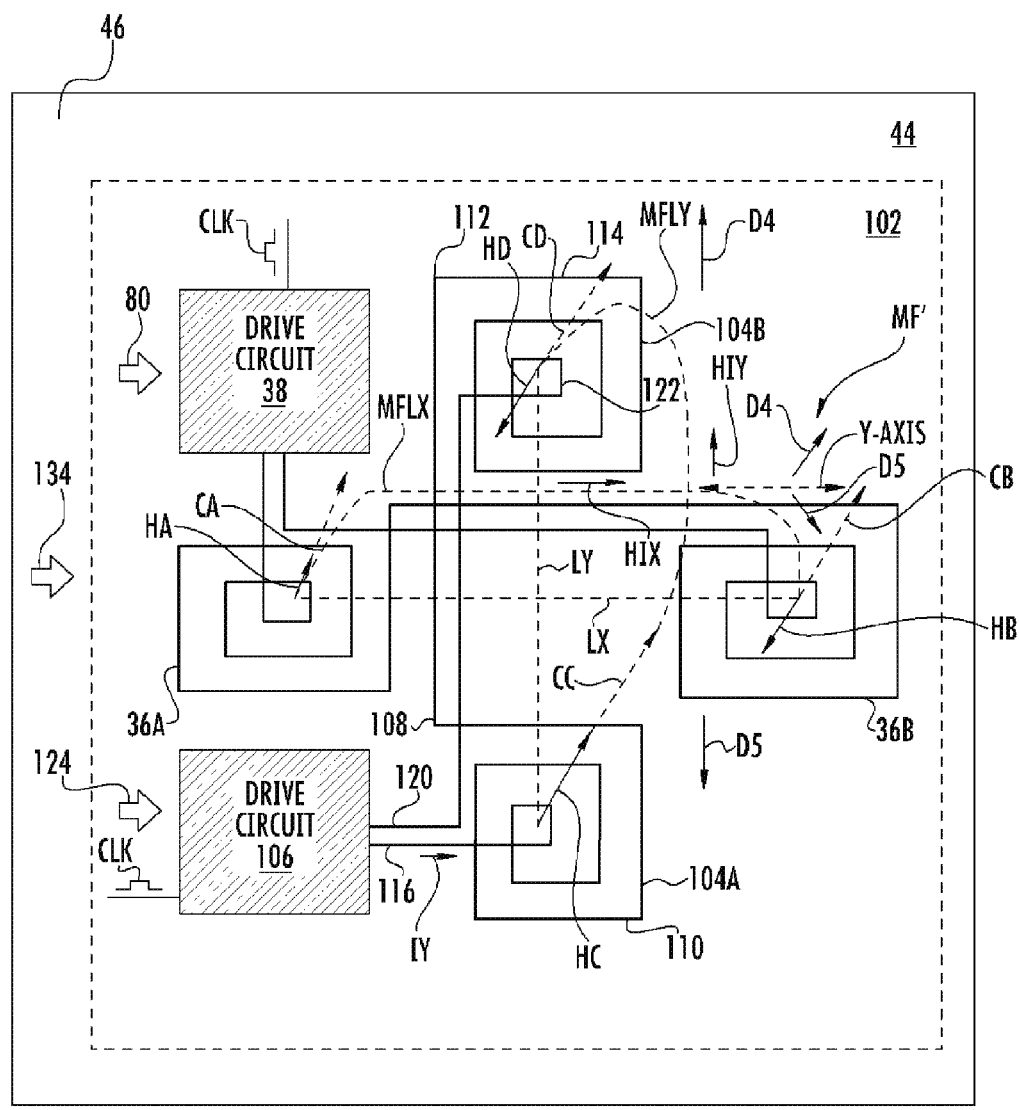
FIG. 11 is a top-down view of another exemplary magnetic field-based contactless transmitter having two pairs of dipole coils arranged to generate in-plane magnetic fields in a magnetic field-based contactless receiver (not shown), wherein the in-plane magnetic fields are generated in substantially orthogonal directions in order to transmit information.

FIG. 11 is a top-down view of another exemplary in-plane magnetic field-based contactless transmitter 102 formed on the substrate 44. The magnetic field-based contactless transmitter 102 can be operated so as to transmit bit symbols that represent multiple bit states. In this embodiment, the magnetic field-based contactless transmitter 102 includes the drive circuit 38 and the pair of dipole coils 36, which operate in the same manner described above with respect to the magnetic field-based contactless transmitter 32 described above. However, in this embodiment, the magnetic field-based contactless transmitter 102 further includes another pair of dipole coils (referred to generically as elements 104 and specifically as elements 104A, 104B) and another drive circuit 106. The pair of dipole coils 104 is also disposed in-plane on the substrate 44 and may also be in the same plane as the pair of dipole coils 36. Accordingly, in this embodiment, the pair of dipole coils 104 is also disposed on the surface 46 of the substrate 44.

However, while the pair of dipole coils 104 is also disposed in-plane with the substrate 44, an alignment of the dipole coils 104 is substantially orthogonal to an alignment of the pair of dipole coils 36. As described above, the dipole coil 36A is wound about the central axis CA and the dipole coil 36B is wound about the central axis CB. A center line LX between the dipole coil 36A and the dipole coil 36B that is in the plane defined by the pair of dipole coils 36 and the pair of dipole coils 104 (i.e., in this example, the surface 46) is shown in FIG. 11. The dipole coil 104A is wound about a central axis CC and the dipole coil 104B is wound about a central axis CD, which are displaced and normal to the plane (i.e., the surface 46). A center line LY between the dipole coil 104A and the dipole coil 104B that is in the plane defined by the pair of dipole coils 36 and the pair of dipole coils 104 (i.e., in this example, the surface 46) is also shown in FIG. 11. As shown in FIG. 11, the center line LY and the center line LX are substantially orthogonal. Consequently, the alignment of the dipole coils 104 is substantially orthogonal to the alignment of the pair of dipole coils 36 in the plane defined by the pair of dipole coils 36 and the pair of dipole coils 104.

The dipole coil 104A is paired with the dipole coil 104B. To pair the dipole coil 104A with the dipole coil 104B, the dipole coil 104A and the dipole coil 104B are disposed on the substrate 44 relative to one another so as to produce another pair of antipodal magnetic dipoles. In this embodiment, the pair of dipole coils 36 and the pair of dipole coils 104 are disposed on the substrate 44 such that the pair of antipodal magnetic dipoles produced by the pair of dipole coils 104 is substantially orthogonal to the pair of antipodal magnetic dipoles produced by the pair of dipole coils 36. As a result, the pair of antipodal magnetic dipoles produced by the dipole coils 104 generates a magnetic field HIY having a magnetic field orientation that is in-plane but substantially orthogonal to the magnetic field orientation of the magnetic field HIX generated by the pair of dipole coils 36. Accordingly, the magnetic field orientation of the magnetic field HIY is set along a Y-axis, as explained in further detail below.

The dipole coil 104A and the dipole coil 104B are connected to one another so as to be part of a same current loop. For example, an external end 108 of an outermost winding 110 formed by the dipole coil 104A is connected to an external end 112 of an outermost winding 114 formed by the dipole coil 104B. The drive circuit 106 is operably associated with the dipole coil 104A and the dipole coil 104B and is configured to drive the dipole coil 104A and the dipole coil 104B to produce the pair of antipodal magnetic dipoles. In this embodiment, the drive circuit 106 is electrically coupled to the pair of dipole coils 104 and is configured to drive the dipole coil 104A in a magnetic field HC and the dipole coil 104B in a magnetic field HD that is substantially opposite the magnetic field HC. More specifically, the drive circuit 106 is coupled to a connection end 116 that is connected to an innermost winding 118 formed by the dipole coil 104A and to a connection end 120 that is connected to an innermost winding 122 formed by the dipole coil 104B. The drive circuit 106 is configured to generate a voltage across the connection ends 116, 120 and produce a current IY across the pair of dipole coils 36. Since the external end 108 is connected to the external end 112, the connection end 116 is connected to the innermost winding 118 and the connection end 120 is connected to the innermost winding 122, the current IY propagates in substantially opposite rotational directions around the pair of dipole coils 104. Accordingly, the magnetic field HC is generated by the dipole coil 36A so as to be substantially opposite the magnetic field HD generated by the dipole coil 36B. In this manner, the pair of dipole coils 104 is configured to generate a pair of antipodal magnetic dipoles wherein one of the dipole coils 104 generates one of the pair of antipodal magnetic dipoles so that it points out of the substrate 44 and another dipole coil 104 generates another one of the pair of antipodal magnetic dipoles so that it points into the substrate 44.

The drive circuit 106 is shown in FIG. 11 generating the current IY so that the current IY propagates from the connection end 116 to the connection end 120. More specifically, a voltage polarity of the voltage generated from the connection end 116 to the connection end 120 is positive. Thus, in FIG. 11, a magnetic polarity of the pair of antipodal magnetic dipoles produced by the dipole coils 104 is such that the dipole coil 104A generates the one of the pair of antipodal magnetic dipoles so that it points out of the substrate 44 and the dipole coil 104B generates the other one of the pair of antipodal magnetic dipoles so that it points into the substrate 44. In this case, the magnetic field HC is directed out of the page along the central axis CC illustrated in FIG. 11, while the magnetic field HD is directed into the page along the central axis CD illustrated in FIG. 11. The magnetic field HIY is generated in-plane orthogonal to the Y-axis and substantially in parallel to a reference direction DR'.

However, the drive circuit 106 is configured to switch a current direction of the current IY such that the current IY can propagate to and from either of the connection ends 116, 120, and thus the drive circuit 106 is configured to switch the magnetic polarity of each of the pair of antipodal magnetic dipoles produced by the dipole coils 104. More specifically, the drive circuit 106 is configured to switch the voltage polarity of the voltage generated from the connection end 116 to the connection end 120, which thereby switches the current direction of the current IY, and thereby ultimately switches the magnetic polarity of each of the pair of antipodal magnetic dipoles produced by the dipole coils 104. For example, the drive circuit 106 may switch the voltage polarity of the voltage generated from the connection end 116 to the connection end 120 to be negative. Accordingly, in this case, the current IY would propagate from the connection end 120 to the connection end 116. As a result, the magnetic polarity of each of the pair of antipodal magnetic dipoles would be such that the dipole coil 104A generates the one of the pair of antipodal magnetic dipoles so that it points into the substrate 44 and the dipole coil 104B generates the other one of the pair of antipodal magnetic dipoles so that it points out of the substrate 44. Therefore, the magnetic field HC would be directed along the central axis CC into the page illustrating FIG. 11, while the magnetic field HD would be directed along the central axis CD out the page illustrating FIG. 11. The magnetic field HIY is generated in-plane in a direction substantially orthogonal to the Y-axis and antipodal to the reference direction DR'. Thus, the magnetic fields HC, HD would remain substantially opposite to one another but would be produced in antipodal arrangements when the current direction of the current IY is switched by the drive circuit 106.

Like the pair of antipodal magnetic dipoles produced by the pair of dipole coils 36 and generated from the magnetic fields HA, HB, the pair of antipodal magnetic dipoles produced by the pair of dipole coils 104 and generated from the magnetic fields HC, HD can thus also be used to communicate data in a contactless manner using the magnetic field-based contactless transmitter 102. For example, a logical state (e.g., a bit state with the bit value of logical "0") of a bit may be represented when the dipole coil 104A provides the one of the pair of antipodal magnetic dipoles so that it points out of the substrate 44 and the dipole coil 104B provides the other one of the pair of antipodal magnetic dipoles so that it points into the substrate 44, while an antipodal logical state (e.g., the bit state with the bit value of logical "1") of the bit may be represented when the dipole coil 104A provides the one of the pair of antipodal magnetic dipoles so that it points into the substrate 44 and the dipole coil 104B provides the other one of the pair of antipodal magnetic dipoles so that it points out of the substrate 44. The pair of antipodal magnetic dipoles may also be used to represent logical states of bit symbols as explained in further detail below.

The drive circuit 38 is configured to receive the logic input 80 and the clock signal CLK and is configured to operate as described above with respect to the magnetic field-based contactless transmitter 32 described above. The drive circuit 106 operates in a similar manner, but is configured to receive a different logic input 124. The logic input 124 represents a logical state. The logic input 124 may include one or more logical signals and the logical state represented by the logic input 124 may be any type of logical state used to encode data. For example, the logical state may be one or more bit states, symbols, and/or the like. The drive circuit 106 may receive the clock signal CLK to coordinate transmission of the logical state provided by the logic input 124. The drive circuit 106 is configured so that the clock signal CLK times when the drive circuit 106 is opaque to the logic input 124 and when the drive circuit 106 is transparent to the logic input 124. In this embodiment, the drive circuit 106 and the drive circuit 38 are configured to operate in a synchronous manner. Alternatively and/or additionally, the drive circuit 106 and the drive circuit 38 may be operated asynchronously and/or independently.

As described in further detail below, a contactless communication device may be provided using the magnetic field-based contactless transmitter 102 shown in FIG. 11 and another magnetic field-based contactless receiver, which may be an MTJ receiver. In one embodiment, the magnetic field-based contactless receiver may include the MTJ 40 and the sense circuit 42 described above with respect to the magnetic field-based contactless receiver 34 described above. Thus, the pair of dipole coils 36 would also be configured to produce the magnetic field HIY (shown in FIGS. 3, 5, and 8) in this other magnetic field-based contactless receiver, as described above. However, as described in further detail below, this other magnetic field-based contactless receiver may include another MTJ and another sense circuit to provide contactless data communication with the pair of dipole coils 104.

For example, the drive circuit 106 is configured to drive the dipole coil 104A for producing the magnetic field HC and the dipole coil 104B for producing the magnetic field HD substantially opposite the magnetic field HC to generate the magnetic field HIY in-plane to the other magnetic field-based contactless receiver disposed on another substrate (such as the substrate 64 shown in FIG. 3). Like the magnetic field HIX, the magnetic field HIY is in-plane to the other magnetic field-based contactless receiver. However, the magnetic field HIY is substantially orthogonal to the magnetic field HIX. The magnetic field-based contactless transmitter 102 is arranged so that the in-plane magnetic field HIY produced by the pair of dipole coils 104 is generated in-plane and substantially orthogonal to the in-plane magnetic field HIX because the alignments of the pair of dipole coils 104 and the pair of dipole coils 36 are substantially orthogonal with respect to one another, as described above.

In one embodiment, the drive circuit 106 is configured to drive the dipole coil 104A for producing the magnetic field HC and the dipole coil 104B for producing the magnetic field HD substantially opposite the magnetic field HC to generate the magnetic field HIY in-plane to a free layer of another MTJ (i.e., one that is different from the MTJ 40). In particular, the magnetic field HIY is generated substantially orthogonal to the Y-axis of the other magnetic field-based contactless receiver, as described in further detail below. As a result, the pair of dipole coils 104 produces the pair of antipodal magnetic dipoles and generates a magnetic field line MFLY that includes the magnetic fields HC, HD of the pair of dipole coils 104. Note that a rotational direction of the magnetic field line MFLY is determined by the magnetic polarity of each of the pair of antipodal magnetic dipoles produced by the pair of dipole coils 104. Thus, the drive circuit 106 is configured to set a magnetic field direction of the magnetic field HIY in one of two antipodal directions, which are the reference direction DR' or antipodal to the reference direction DR' (i.e., −DR').

The drive circuit 106 is configured to switch the magnetic polarity of each of the pair of antipodal magnetic dipoles produced by the pair of dipole coils 104 and set the magnetic field orientation of the magnetic field HIY in accordance with the logical state of the logic input 124. For example, the logic input 124 may be a single bit signal and the logical state may be a bit state (i.e., with a bit value of logical "0" or "1") of the bit signal. As mentioned above, the drive circuit 106 is configured to generate the current IY along the pair of dipole coils 104 by generating the voltage from the connection end 116 to the connection end 120. The drive circuit 106 sets the magnetic polarity of each of the pair of antipodal magnetic dipoles produced by the pair of dipole coils 104 by setting the voltage polarity of the voltage from the connection end 116 to the connection end 120. This is because the voltage polarity of the voltage from the connection end 116 to the connection end 120 determines the current direction of the current IY. The logic state (in this example, the bit state) of the logic input thus corresponds to the voltage polarity of the voltage, and thus the current direction of the current IY. When the drive circuit 106 is transparent, the drive circuit 106 is responsive to the bit state of the logic input 124 such that the voltage polarity (and thus the current direction of the current IY) is set in accordance with the bit state.

For example, a logical state of a bit having one logical value (e.g., a bit state with a bit value of logical "0") may be represented when the dipole coil 104A provides the one of the pair of antipodal magnetic dipoles so that it points out of the substrate 44 and the dipole coil 104B provides the other one of the pair of antipodal magnetic dipoles so that it points into the substrate 44. The logical state of the bit having an antipodal logical value (e.g., the bit state with the bit value of logical "1") may be represented when the dipole coil 104A provides the one of the pair of antipodal magnetic dipoles so that it points into the substrate 44 and the dipole coil 104B provides the other one of the pair of antipodal magnetic dipoles so that it points out of the substrate 44. The bit state with the bit value of logical "0" may thus correspond to the voltage polarity of the voltage from the connection end 116 to the connection end 120 being positive and the current direction of the current IY being from the connection end 116 to the connection end 120. On the other hand, the bit state with the antipodal bit value of logical "1" may correspond to the voltage polarity of the voltage from the connection end 116 to the connection end 120 being negative and the current direction of the current IY being from the connection end 120 to the connection end 116.

While the drive circuit 106 is transparent, and in response to the bit state of the logic input 124 having the bit value of logical "0," the drive circuit 106 may be configured to generate the voltage with the voltage polarity being positive and the current direction of the current IY being from the connection end 116 to the connection end 120. As such, the drive circuit 106 is configured to set the magnetic polarity of each of the pair of antipodal magnetic dipoles such that the dipole coil 104A generates the one of the pair of antipodal magnetic dipoles so that it points out of the substrate 44 and the dipole coil 104B generates the other one of the pair of antipodal magnetic dipoles so that it points into the substrate 44. As a result, the magnetic field HC is generated out of the substrate 44 along the central axis CC, and the magnetic field HD is generated into the substrate 44 along the central axis CD. Accordingly, the magnetic field HIY is generated to have a magnetic field orientation in a direction DR', which is substantially orthogonal to the Y-axis. Furthermore, while the drive circuit 106 is transparent, and in response to the bit state of the logic input 124 having the bit value of logical "1," the drive circuit 106 may be configured to generate the voltage with the voltage polarity being negative and the current direction of the current IY being from the connection end 120 to the connection end 116. As such, the drive circuit 106 is configured to set the magnetic polarity of each of the pair of antipodal magnetic dipoles such that the dipole coil 104A generates the one of the pair of antipodal magnetic dipoles so that it points into the substrate 44 and the dipole coil 104B generates the other one of the pair of antipodal magnetic dipoles so that it points out of the substrate 44. Consequently, the magnetic field HC is generated into the substrate 44 along the central axis CC, and the magnetic field HD is generated out of the substrate 44 along the central axis CD. Accordingly, the magnetic field HIY is generated to have a magnetic field orientation antipodal to the direction DR' and substantially orthogonal to the Y-axis. Using the pair of antipodal magnetic dipoles produced by the pair of dipole coils 104 that generates the magnetic fields HC, HD, the magnetic field-based contactless transmitter 102 can thus be used to communicate data in a contactless manner. The pair of antipodal magnetic dipoles may also be used to represent logical states of bit symbols, as explained in further detail below.

Figure 12:
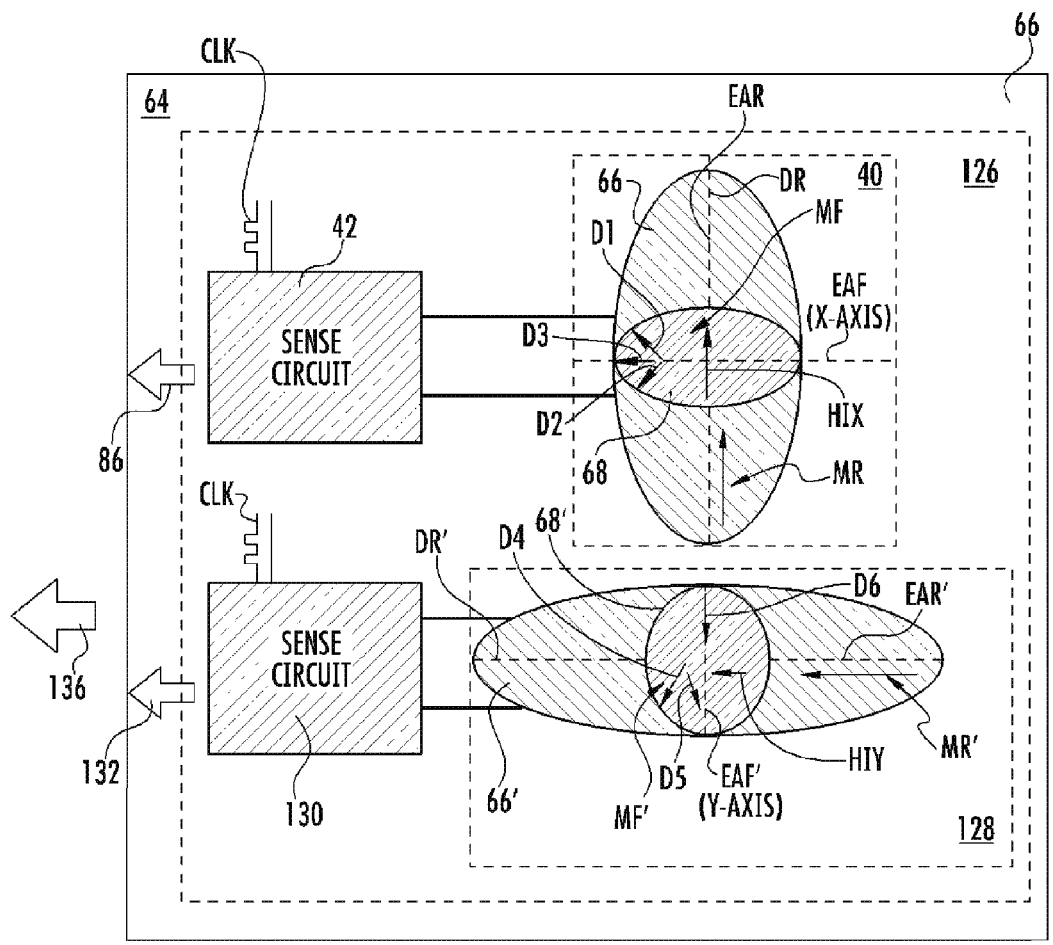
FIG. 12 is a top-down view of another exemplary magnetic field-based contactless receiver that may be utilized with the magnetic field-based contactless transmitter shown in FIG. 11 to provide a contactless communication device, wherein the magnetic field-based contactless receiver has two MTJs arranged so that one in-plane magnetic field is generated in one of the substantially orthogonal directions and the other in-plane magnetic field is generated in the other substantially orthogonal direction in order to receive the information.

Referring now to FIG. 11 and FIG. 12, FIG. 12 is a top-down view of an exemplary in-plane magnetic field-based contactless receiver 126 that may be utilized with the magnetic field-based contactless transmitter 102 shown in FIG. 11 to provide a contactless communication device. The magnetic field-based contactless receiver 126 is formed on the substrate 64. As shown in FIG. 12, the magnetic field-based contactless receiver 126 has two MTJs arranged so that the in-plane magnetic field HIX is generated in one of the substantially orthogonal directions and the other in-plane magnetic field HIY is generated in the other substantially orthogonal direction in order to receive the bit symbol. In this embodiment, the magnetic field-based contactless receiver 126 has the MTJ 40 and the sense circuit 42 described above with respect to the magnetic field-based contactless receiver 34. The MTJ 40 and the sense circuit 42 operate in the same manner described above to receive data from the pair of dipole coils 36 and the drive circuit 38. The sense circuit 42 thus generates the logic output 86. However, the magnetic field-based contactless receiver 126 further includes an MTJ 128 and a sense circuit 130.

The MTJ 128 is disposed in-plane to the substrate 64 and is identical to the MTJ 40 except that an alignment of the MTJ 128 on the substrate 64 is substantially orthogonal to an alignment of the MTJ 40. Furthermore, the pair of dipole coils 104 (shown in FIG. 11) is configured to produce the pair of antipodal magnetic dipoles so as to generate the magnetic field HIY in-plane to the MTJ 128 and substantially orthogonal to the magnetic field HIX produced by the pair of antipodal magnetic dipoles of the pair of dipole coils 36 (shown in FIG. 11).

As such, the MTJ 128 includes a reference layer 66' and a free layer 68' separated by a tunneling barrier. The reference layer 66' of the MTJ 128 is identical to the reference layer 66 of the MTJ 40, except that the reference layer 66' has an easy axis EAR' that is substantially orthogonal to the easy axis EAR of the reference layer 66 and parallel to the easy axis EAF (i.e., the X-axis) of the free layer 68. A magnetization MR' of the reference layer 66' thus has a magnetic orientation that is fixed in the direction DR' along the easy axis EAR', which is substantially orthogonal to the magnetic orientation of the reference layer 66 that is fixed in the direction DR along the easy axis EAR. A hard axis of the reference layer 66' is thus in parallel with the easy axis EAR of the reference layer 66 and substantially orthogonal to the hard axis of the reference layer 66.

The free layer 68' of the MTJ 128 is identical to the free layer 68 of the MTJ 40, except that the free layer 68' has an easy axis EAF' that is substantially orthogonal to the easy axis EAF of the free layer 68 and parallel to the easy axis EAR of the reference layer 66. Accordingly, while the easy axis EAF of the free layer 68 defines the X-axis of the magnetic field-based contactless receiver 126, the easy axis EAF' of the free layer 68' defines a Y-axis of the magnetic field-based contactless receiver 126. Like the magnetization MF of the free layer 68, a magnetization MF' of the free layer 68' is provided along the easy axis EAF' (i.e., the Y-axis) in response to the magnetic field HIY, wherein the magnetic field HIY is generated in-plane to the free layer 68' and has a magnetic field orientation along the easy axis EAF'. Thus, the magnetization MF' is substantially orthogonal to the magnetic orientation of the reference layer 66' that is fixed in the direction DR' when the magnetic field HIY is generated. When the magnetic field HIY is generated, a hard axis of the free layer 68' is in parallel to the easy axis EAF and substantially orthogonal to the easy axis EAR of the MTJ 40.

As mentioned above, the MTJ 128 is identical to the MTJ 40 except that the MTJ 128 and the MTJ 40 have alignments which are substantially orthogonal with respect to one another. More specifically, the free layer 68' has a magnetization MF' that is switchable between being oriented in a fourth direction D4 and a fifth direction D5 around the easy axis EAF'. Like the MTJ 40, the MTJ 128 thus has a resistance that is switchable to and from the first resistive state and the second resistive state, and has a magnetic orientation alignment that is switchable to and from the first magnetic orientation alignment state and the second magnetic orientation alignment state. When the magnetization MF' is oriented in the direction D4 along the easy axis EAF', the resistance of the MTJ 128 is provided in the first resistive state (and thus the first magnetic orientation alignment state) and is approximately equal to resistance R1. Accordingly, the free layer 68' is configured to set the magnetic orientation of the magnetization MF' in the fourth direction D4 around the easy axis EAF' in response to the magnetic field HIY having the magnetic field orientation substantially parallel to the reference direction DR', which is orthogonal to the easy axis EAF'. In this example, the first resistive state (and the first magnetic orientation alignment state) corresponds to the bit state with the bit value of logical "0." When the magnetization MF' is oriented in the fifth direction D5 along the easy axis EAF', the resistance of the MTJ 128 is provided in the second resistive state (and thus the second magnetic orientation alignment state) and is approximately equal to resistance R2. Accordingly, the free layer 68 is configured to set the magnetic orientation of the magnetization MF' in the fifth direction D5 along the easy axis EAF' in response to the magnetic field HIY having the magnetic field orientation antipodal to the reference direction DR', which is also orthogonal to the easy axis EAF' (i.e., the Y-axis). In this example, the second resistive state (and the first magnetic orientation alignment state) corresponds to the bit state with the bit value of logical "1."

It should be noted that like the free layer 68 of the MTJ 40, the MTJ 128 is configured to provide the magnetization MF' such that the magnetization MF' is oriented in a sixth direction D6 along the easy axis EAF' of the free layer 68' when no magnetic field HIY is generated. In this embodiment, the sixth direction D6 is substantially orthogonal to the reference direction DR' of the magnetization MR' and the easy axis EAR'. The resistance of the MTJ 128 is thus set in the third resistive state, which is approximately equal to resistance R3, when no magnetic field HIY is generated. Furthermore, the magnetic orientation alignment of the MTJ 128 is provided in the third magnetic orientation alignment state when no magnetic field HIY is generated.

As shown in FIG. 12, the sense circuit 130 is configured to detect data communicated contactlessly from the magnetic field-based contactless transmitter 102 (shown in FIG. 11) to the magnetic field-based contactless receiver 126. In this embodiment, the sense circuit 42 and the MTJ 40 are configured to operate in the same manner described above with respect to the magnetic field-based contactless receiver 34. Furthermore, the MTJ 128 and the sense circuit 130 operate similarly to the sense circuit 42 and the MTJ 40, except that the MTJ 128 and the sense circuit 130 operate with the pair of dipole coils 104 and the drive circuit 106, not with the pair of dipole coils 36 and the drive circuit 38.

Accordingly, the sense circuit 130 is configured to sense the resistance of the MTJ 128. By detecting whether the MTJ 128 is in the first resistive state or the second resistive state, the sense circuit 130 is further configured to sense whether the magnetic orientation alignment of the MTJ 128 is in the first magnetic orientation alignment state (corresponding to the first resistive state) or the second magnetic orientation alignment state (corresponding to the first resistive state).

In FIG. 12, the sense circuit 130 is further configured to transmit a logic output 132 that represents a logical state based on the resistance of the MTJ 128. The logic output 132 may include one or more logical signals. The logical state represented by the logic output 132 may be any type of logical state used to encode data. For example, the logical state may be one or more bit states, symbols, and/or the like. In this embodiment, the sense circuit 130 receives the clock signal CLK to coordinate transmission of the logical state in the logic output 132. The sense circuit 130 is configured so that the clock signal CLK times when the sense circuit 130 is opaque to the resistance of the MTJ 128 and when the sense circuit 130 is transparent to the resistance of the MTJ 128.

When the sense circuit 130 is transparent, the sense circuit 130 is configured to set the logical state of the logic output 132 in accordance with the resistance of the MTJ 128, and thus in accordance with the magnetic orientation alignment of the MTJ 128. As such, the logical state of the logic output 132 corresponds to the logical state of the logic input 124 (shown in FIG. 11) received by the drive circuit 106 (shown in FIG. 11). However, the logical state of the logic output 132 may be delayed with respect to the logical state of the logic input 124 since the logical state of the logic output 132 may be provided in a different portion of a clock cycle of the clock signal CLK or in a different clock cycle. Alternatively, a different independent clock signal, or a different clock signal based on the clock signal CLK, may be used with the sense circuit 130.

In this embodiment, the logic output 132 is a single bit signal and the logic state may be a bit state (i.e., has the bit value of either logical "0" or "1") of the bit signal. As mentioned above, the drive circuit 106 (shown in FIG. 11) is configured to generate the magnetic polarity of each of the pair of antipodal magnetic dipoles in accordance with the bit state of the logic input 124 (shown in FIG. 11). Accordingly, the magnetic field orientation of the magnetic field HIY is produced in accordance with the bit state of the logic input 124. The MTJ 128 is configured so that the resistance (and thus the magnetic orientation alignment) of the MTJ 128 is switched to and from the first resistive state (and thus the first magnetic orientation alignment state) and the second resistive state (and thus the second magnetic orientation alignment state) of the MTJ 128 in accordance with the magnetic field orientation of the magnetic field HIY. When the sense circuit 130 is transparent, the sense circuit 130 is responsive to the bit state of the logic input 124 such that the voltage polarity (and thus the current direction of the current IY) is set in accordance with the bit state. The resistance of the MTJ 128 and the magnetic orientation alignment of the MTJ 128 thus represent the bit state of the logic input 124 shown in FIG. 11.

Continuing with the example described above with regard to FIG. 11, while the drive circuit 106 (shown in FIG. 11) is transparent, and in response to the bit state of the logic input 124 having the bit value of logical "0," the drive circuit 106 (shown in FIG. 11) is configured to set the magnetic polarity of each of the pair of antipodal magnetic dipoles such that the dipole coil 104A (shown in FIG. 11) generates the one of the pair of antipodal magnetic dipoles so that it points out of the substrate 44 and the dipole coil 104B (shown in FIG. 11) generates the other one of the pair of antipodal magnetic dipoles so that it points into the substrate 44. As a result, the magnetic field HIY shown in FIG. 12 is generated in the free layer 68' such that the magnetic field orientation of the magnetic field HIY is set substantially parallel to the reference direction DR'. In response, the magnetic orientation of the magnetization MF' of the free layer 68' is provided in the fourth direction D4 around the easy axis EAF' (i.e., the negative rotation relative to the Y-axis) of the free layer 68'. Consequently, the resistance of the MTJ 128 is set in the first resistive state and the magnetic orientation alignment of the MTJ 128 is provided in the first magnetic orientation alignment state. The magnetic field orientation of the magnetic field HIY being substantially parallel to the reference direction DR', the first resistive state of the resistance, and the first magnetic orientation alignment state of the MTJ 128 thus correspond to the bit state having the bit value of logical "0." While the sense circuit 130 is transparent, and in response to the resistance being in the first resistive state and the MTJ 128 being in the first magnetic orientation alignment state, the sense circuit 130 is configured to generate the logic output 132 such that the bit state of the logic output 132 has the bit value of logical "0."

While the drive circuit 106 (shown in FIG. 11) is transparent, and in response to the bit state of the logic input 124 (shown in FIG. 11) having a bit value of logical "1," the drive circuit 106 is configured to set the magnetic polarity of each of the pair of antipodal magnetic dipoles such that the dipole coil 104A (shown in FIG. 11) generates the one of the pair of antipodal magnetic dipoles so that it points into the substrate 44 and the dipole coil 104B (shown in FIG. 11) generates the other one of the pair of antipodal magnetic dipoles so that it points out of the substrate 44. As a result, the magnetic field HIY shown in FIG. 11 is generated in the free layer 68' such that the magnetic field orientation of the magnetic field HIY is set antipodal to the reference direction DR' (i.e., −DR) along the easy axis EAF' (i.e., the positive rotation relative to the Y-axis) of the free layer 68'. In response, the magnetic orientation of the magnetization MF' of the free layer 68' is provided in the fifth direction D5 of the free layer 68'. Consequently, the resistance of the MTJ 128 is set in the second resistive state and the magnetic orientation alignment of the MTJ 128 is provided in the second magnetic orientation alignment state. The magnetic field orientation of the magnetic field HIY is provided antipodally to the direction DR'. In response, the magnetic orientation of the magnetization MF' of the free layer 68' is provided in the fifth direction D5. Furthermore, the MTJ 128 is set to the second resistive state and the second magnetic orientation alignment state. The fifth direction D5, the second resistive state, and the second magnetic orientation alignment state thus correspond to the bit state having the bit value of logical "1."

While the sense circuit 130 is transparent, and in response to the resistance being in the second resistive state and the MTJ 128 being in the second magnetic orientation alignment state, the sense circuit 130 is configured to generate the logic output 132 such that the bit state of the logic output 132 has the bit value of logical "1." In this manner, data from the magnetic field-based contactless transmitter 102 (shown in FIG. 11) is transferred to the magnetic field-based contactless receiver 34 and may be used by circuitry downstream from the sense circuit 130. As explained in further detail below, some embodiments of the sense circuit 130 may further be operable to sense when the resistance is in the third resistive state and when the magnetic orientation alignment of the MTJ 128 is in the third magnetic orientation alignment state.

Referring now to FIG. 11 and FIG. 12, the description of the magnetic field-based contactless transmitter 102 and the magnetic field-based contactless receiver 126 may be provided as a contactless communication device to transfer data. Given the exemplary operation described above, two bits of data may be communicated simultaneously. In one embodiment, the magnetic field-based contactless transmitter 102 is operable to receive a logic input 134, which in this example is a two-bit logic input that includes the logic input 80 and the logic input 124. Additionally, the magnetic field-based contactless receiver 126 may be configured to transmit a logic output 136, which in this example is a two-bit logic output that includes the logic output 86 and the logic output 132. As such, a logical state of the logic input 134 is a bit symbol (i.e., a two-bit symbol). Therefore, the magnetic field-based contactless transmitter 102 is configured to transmit the bit symbol using the pair of dipole coils 36 and the pair of dipole coils 104 and the magnetic field-based contactless receiver 126 is configured to receive the bit symbol using the MTJ 40 and the MTJ 128. As a result, a logical state of the logic output 136 is also a bit symbol (i.e., a two-bit symbol).

Table I below describes one embodiment of the operation of the magnetic field-based contactless transmitter 102 based on the bit symbol of the logic input 134 and in accordance with the exemplary configuration of the pair of dipole coils 36, the drive circuit 38, the pair of dipole coils 104, and the drive circuit 106 described above.

TABLE I

| Bit Symbol of the Logic Input 134 | Bit State of the Logic Input 80 | Bit State of the Logic Input 124 | Direction of the Magnetic Field HIX | Direction of the Magnetic Field HIY |
|---|---|---|---|---|
| 00 | 0 | 0 | DR | DR' |
| 01 | 0 | 1 | DR | -DR' |
| 10 | 1 | 0 | -DR | DR' |
| 11 | 1 | 1 | -DR | -DR' |

Table II below describes one embodiment of the operation the magnetic field-based contactless receiver 126 and the resulting logical state of the logic output 136 in accordance with the exemplary configuration of the MTJ 40, the sense circuit 42, the MTJ 128, and the sense circuit 130 described above.

TABLE II

| Direction of the Magnetic Field HIX | Direction of the Magnetic Field HIY | Resistance of the MTJ 40 | Resistance of the MTJ 128 | Bit State of the Logic Output 86 | Bit State of the Logic Output 132 | Bit Symbol of the Logic Output 136 |
|---|---|---|---|---|---|---|
| DR | DR' | R1 | R1 | 0 | 0 | 00 |
| DR | -DR' | R1 | R2 | 0 | 1 | 01 |
| -DR | DR' | R2 | R1 | 1 | 0 | 10 |
| -DR | -DR' | R2 | R2 | 1 | 1 | 11 |

In an alternative embodiment of the magnetic field-based contactless transmitter 102, the magnetic field-based contactless transmitter 102 may include a decoder (not shown) configured to receive the logic input 134 and generate the logic input 80 and the logic input 124 based on the logic input 134. For instance, the logic input 134 may have more than two bits, and thus the logical state of the logic input 134 may be a multiple-bit symbol. In one example, the logic input 134 includes three bit signals, and thus the logical state of the logic input 134 is a three-bit symbol. The decoder may be configured to generate the logic input 80 having a logic state having a logical value of "+1," "0," or "-1." As such, the drive circuit 38 may be configured to set the magnetic polarity of each of the pair of antipodal magnetic dipoles such that the magnetic field orientation of the magnetic field HIX is substantially parallel to the reference direction DR in response to the logical state of the logic input 80 having one of the logical values (i.e., "+1," "0," or "4"), such that the magnetic field orientation of the magnetic field HIX antipodal to the reference direction DR (i.e., -DR) in response to the logical state of the logic input 80 having another one of the logical values (i.e., "+1," "0," or "4"), and such that the magnetic field HIX is not generated in response to the logical state of the logic input 80 having a last one of the logical values (i.e., "+1," "0," or "-1"). Additionally, the drive circuit 106 may be configured to set the magnetic polarity of each of the pair of antipodal magnetic dipoles such that the magnetic field orientation of the magnetic field HIY is substantially parallel to the reference direction DR' in response to the logical state of the logic input 124 having one of the logical values (i.e., "+1," "0," or "4"), such that the magnetic field orientation of the magnetic field HIY is antipodal to the reference direction DR' (i.e., -DR) in response to the logical state of the logic input 124 having another one of the logical values (i.e., "+1," "0," or "4"), and such that the magnetic field HIY is not generated in response to the logical state of the logic input 124 having a last one of the logical values (i.e., "+1, "0," or "4").

Table III below describes one embodiment of the operation of the magnetic field-based contactless transmitter 102 based on the bit symbol of the logic input 134 and in accordance with the exemplary alternative configuration. Since Table III describes the logical state of the logic input 80 and the logical state of the logic input 124 given the bit symbol of the logic input 134, Table III also describes an exemplary operation of the decoder.

TABLE III

| Bit Symbol of the Logic Input 134 | Bit State of the Logic Input 80 | Bit State of the Logic Input 124 | Direction of the Magnetic Field HIX | Direction of the Magnetic Field HIY |
|---|---|---|---|---|
| 000 | -1 | -1 | DR | DR |
| 001 | 0 | -1 | None | DR |

TABLE III-continued

| Bit Symbol of the Logic Input 134 | Bit State of the Logic Input 80 | Bit State of the Logic Input 124 | Direction of the Magnetic Field HIX | Direction of the Magnetic Field HIY |
|---|---|---|---|---|
| 010 | +1 | −1 | −DR | DR |
| 011 | −1 | 0 | DR | None |
| 100 | +1 | 0 | −DR | None |
| 101 | −1 | +1 | DR | −DR |
| 110 | 0 | +1 | None | −DR |
| 111 | +1 | +1 | −DR | −DR |
| Drop | 0 | 0 | None | None |

To operate with the alternative embodiment of the magnetic field-based contactless transmitter 102 described above, an alternative embodiment of the magnetic field-based contactless receiver 126 may be provided. The sense circuit 42 is still configured to sense the resistance and the magnetic orientation alignment of the MTJ 40. The sense circuit 130 is also still configured to sense the resistance and the magnetic orientation alignment of the MTJ 40. However, as described above, the magnetic field HIX is not generated for the last one of the logical states of the logic input 80. Accordingly, the sense circuit 42 senses the MTJ 40 having the resistance in the first resistive state (and thus the magnetic orientation alignment in the first magnetic orientation alignment state) in response to the logical state of the logic input 80 having one of the logical values, the resistance in the second resistive state (and thus the magnetic orientation alignment in the second magnetic orientation alignment state) in response to the logical state of the logic input 80 having another one of the logical values, and the resistance in the third resistive state (and thus the magnetic orientation alignment in the third magnetic orientation alignment state) in response to the logical state of the logic input 80 having the last one of the logical values. The sense circuit 42 is configured to generate the logic output 86 such that the logical state is set in accordance with the resistance (and the magnetic orientation alignment). As such, the sense circuit 42 may be configured to generate the logic output 86 such that the logic state has a logical value of "+1," "0," or "−1" in accordance with the resistance (and thus the magnetic orientation alignment) of the MTJ 40.

In the alternative embodiment of the magnetic field-based contactless receiver 126, the sense circuit 130 is still configured to sense the resistance and the magnetic orientation alignment of the MTJ 128. However, as described above, the magnetic field HIY is not generated in response to the logical state of the logic input 124 having the last one of the logical values. Accordingly, the sense circuit 130 senses the MTJ 128 having the resistance in the first resistive state (and thus the magnetic orientation alignment in the first magnetic orientation alignment state) in response to the logical state of the logic input 124 having one of the logical values, the resistance in the second resistive state (and thus the magnetic orientation alignment in the second magnetic orientation alignment state) in response to the logical state of the logic input 124 having another one of the logical values, and the resistance in the third resistive state (and thus the magnetic orientation alignment in the third magnetic orientation alignment state) in response to the logical state of the logic input 124 having the last one of the logical values. The sense circuit 130 is configured to generate the logic output 132 such that the logic state is set in accordance with the resistance (and the magnetic orientation alignment). In this embodiment, the sense circuit 130 is configured to generate the logic output 132 such that the logical state has the logical value of "+1," "0," or "−1" in accordance with the resistance (and the magnetic orientation alignment).

In one embodiment, the magnetic field-based contactless receiver 126 may include an encoder (not shown) configured to receive the logic output 86 and the logic output 132, and to generate the logic output 136 having a logical state based on the logical state of the logic output 86 and the logical state of the logic output 132. For example, the encoder may be configured to generate the logic output 136 from the logic output 86 and the logic output 132 as three bit signals. Accordingly, the logical state of the logic output 136 is a three-bit symbol.

Table IV below describes one embodiment of the operation of the magnetic field-based contactless receiver 126 and the resulting logical state of the logic output 136 in accordance with the alternative configuration of the MTJ 40, the sense circuit 42, the MTJ 128, and the sense circuit 130. Since Table IV describes the bit symbol of the logic output 136 given the logical state of the logic output 86 and the logical state of the logic output 132, Table IV also describes an exemplary operation of the encoder.

TABLE IV

| Direction of the Magnetic Field HIX | Direction of the Magnetic Field HIY | Resistance of the MTJ 40 | Resistance of the MTJ 128 | Bit State of the Logic Output 86 | Bit State of the Logic Output 132 | Bit Symbol of the Logic Output 136 |
|---|---|---|---|---|---|---|
| DR | DR | R1 | R1 | −1 | −1 | 000 |
| None | DR | R3 | R1 | 0 | −1 | 001 |
| −DR | DR | R2 | R1 | +1 | −1 | 010 |
| DR | None | R1 | R3 | −1 | 0 | 011 |
| −DR | None | R2 | R3 | +1 | 0 | 100 |
| DR | −DR | R1 | R3 | −1 | +1 | 101 |
| None | −DR | R3 | R2 | 0 | +1 | 110 |
| −DR | −DR | R2 | R2 | +1 | +1 | 111 |
| None | None | R3 | R3 | 0 | 0 | Drop |

Figure 13:
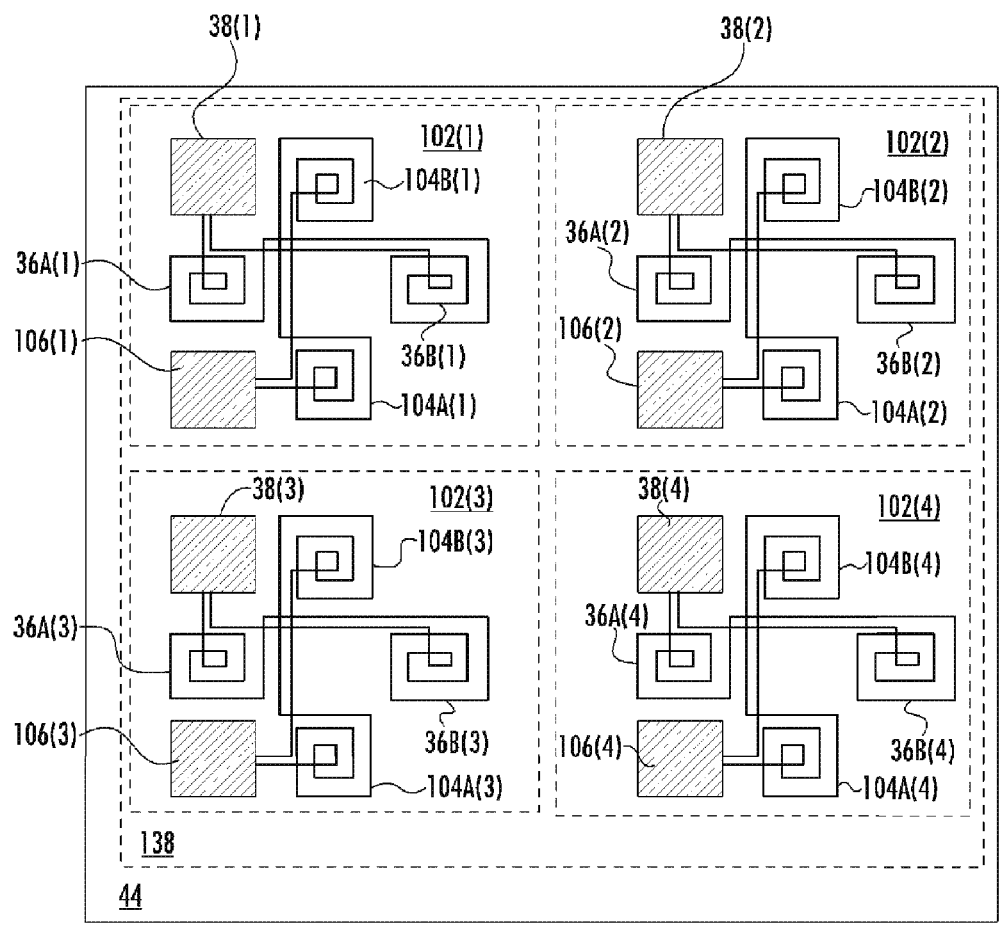
FIG. 13 illustrates still another exemplary magnetic field-based contactless transmitter with multiple transmitter cells, wherein each transmitter cell has two pairs of dipole coils arranged like the pair of dipole coils in FIG. 11 in order to transmit multi-bit information symbols in parallel.

FIG. 13 illustrates still another exemplary in-plane magnetic field-based contactless transmitter 138 with multiple transmitter cells 102(1), 102(2), 102(3), 102(4) disposed in-plane to the substrate 44. Each of the transmitter cells 102(1), 102(2), 102(3), 102(4) is identical to the magnetic field-based contactless transmitter 102 described above. Thus, the transmitter cell 102(1) has a pair of dipole coils (referred to generically as elements 36(1) and specifically as elements 36A(1), 36B(1)) operably associated with a drive circuit 38(1), the transmitter cell 102(2) has a pair of dipole coils (referred to generically as elements 36(2) and specifically as elements 36A(2), 36B(2)) operably associated with a drive circuit 38(2), the transmitter cell 102(3) has a pair of dipole coils (referred to generically as elements 36(3) and specifically as elements 36A(3), 36B(3)) operably associated with a drive circuit 38(3), and the transmitter cell 102(4) has a pair of dipole coils (referred to generically as elements 36(4) and specifically as elements 36A(4), 36B(4)) operably associated with a drive circuit 38(4). Each of the pairs of dipole coils 36(1), 36(2), 36(3), 36(4) is identical to the pair of dipole coils 36 described above. Similarly, each of the drive circuits 38(1), 38(2), 38(3), 38(4) is identical to the drive circuit 38 described above.

Additionally, the transmitter cell 102(1) has a pair of dipole coils (referred to generically as elements 104(1) and specifically as elements 104A(1), 104B(1)) operably associated with a drive circuit 106(1), the transmitter cell 102(2) has a pair of dipole coils (referred to generically as elements 104(2) and specifically as elements 104A(2), 104B(2)) operably associated with a drive circuit 106(2), the transmitter cell 102(3) has a pair of dipole coils (referred to generically as elements 104(3) and specifically as elements 104A(3), 104B(3)) operably associated with a drive circuit 106(3), and the transmitter cell 102(4) has a pair of dipole coils (referred to generically as elements 104(4) and specifically as elements 104A(4), 104B(4)) operably associated with a drive circuit 106(4). Each of the pairs of dipole coils 104(1), 104(2), 104(3), 104(4) is identical to the pair of dipole coils 104 described above. Similarly, each of the drive circuits 106(1), 106(2), 106(3), 106(4) is identical to the drive circuit 106 described above. In this embodiment, the exemplary magnetic field-based contactless transmitter 138 is configured to transmit a different bit symbol from each of the multiple transmitter cells 102(1), 102(2), 102(3), 102(4) simultaneously.

Figure 14:
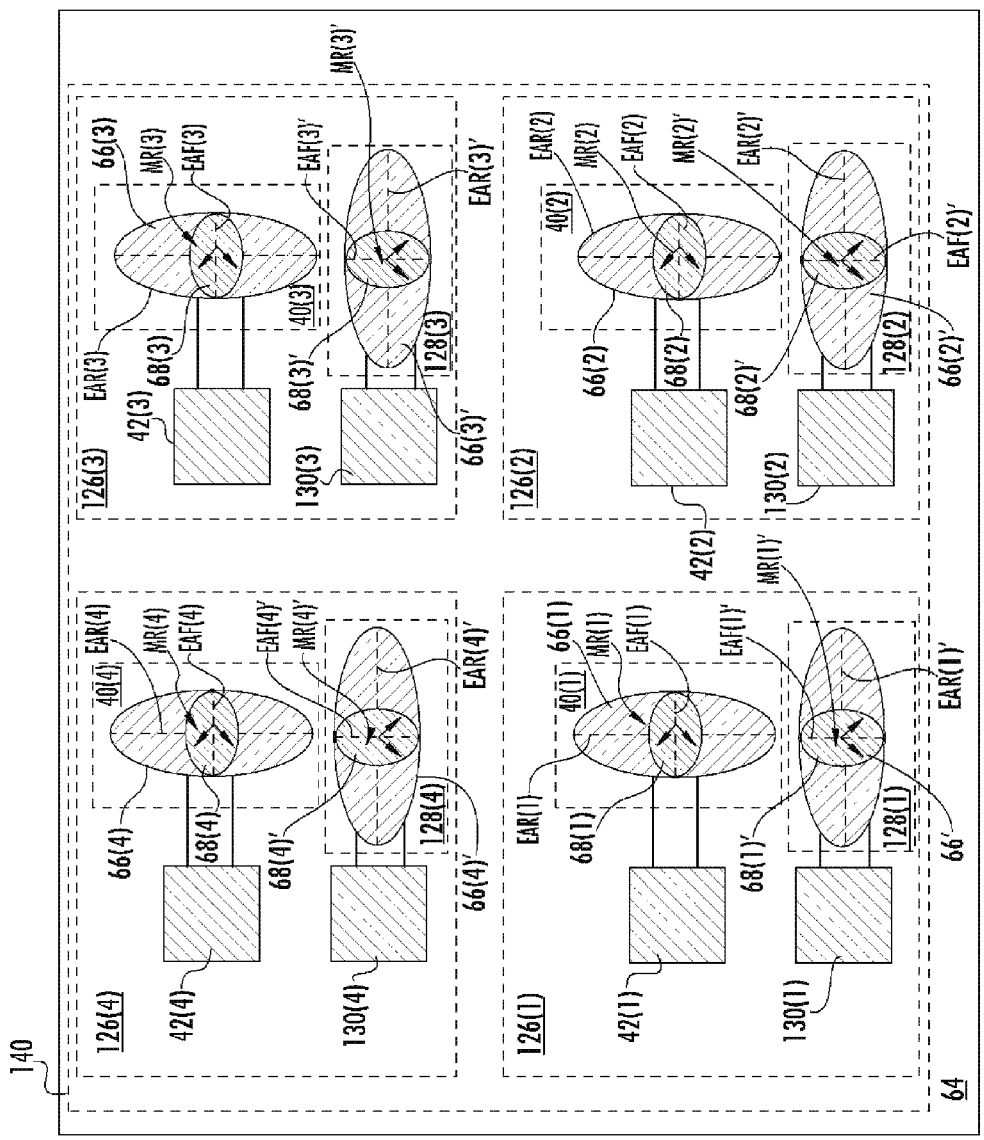
FIG. 14 illustrates another exemplary magnetic field-based contactless receiver that may be utilized with the magnetic field-based contactless transmitter shown in FIG. 13 to provide a contactless communication device, and which has multiple receiver cells, wherein each receiver cell has two MTJs arranged like the MTJs in FIG. 13 in order to receive the multi-bit information symbols in parallel.

FIG. 14 illustrates another exemplary in-plane magnetic field-based contactless receiver 140 disposed on the substrate 64 that may be utilized with the magnetic field-based contactless transmitter 138 shown in FIG. 13 to provide a contactless communication device. The magnetic field-based contactless receiver 140 has multiple receiver cells 126(1), 126(2), 126(3), 126(4) disposed in-plane to the substrate 64. Each of the receiver cells 126(1), 126(2), 126(3), 126(4) is identical to the magnetic field-based contactless receiver 126 described above.

The receiver cell 126(1) is configured to receive data from the transmitter cell 102(1) in the same manner described above with respect to the magnetic field-based contactless receiver 126 shown in FIG. 12 and the magnetic field-based contactless transmitter 102 shown in FIG. 11. Thus, the receiver cell 126(1) has an MTJ 40(1), a sense circuit 42(1), an MTJ 128(1), and a sense circuit 130(1). The MTJ 40(1) has a reference layer 66(1) and a free layer 68(1), wherein a tunneling barrier is defined between the reference layer 66(1) and the free layer 68(1). The MTJ 40(1) is disposed in-plane to the substrate 64. Furthermore, the reference layer 66(1) defines an easy axis EAR(1) in-plane to the substrate 64 such that a magnetization MR(1) of the reference layer 66(1) is oriented along the easy axis EAR(1). The free layer 68(1) defines an easy axis EAF(1) substantially orthogonal to the easy axis EAR(1) and in-plane to the substrate 64. The sense circuit 42(1) is configured to sense a resistance of the MTJ 40(1). Accordingly, the MTJ 40(1) is identical to the MTJ 40 and the sense circuit 42(1) is identical to the sense circuit 42 shown in FIG. 11. Additionally, the MTJ 128(1) has a reference layer 66(1)' and a free layer 68(1)', wherein a tunneling barrier is defined between the reference layer 66(1)' and the free layer 68(1)'. The MTJ 128(1) is disposed in-plane to the substrate 64. Furthermore, the reference layer 66(1)' defines an easy axis EAR(1)' in-plane to the substrate 64 such that a magnetization MR(1)' of the reference layer 66(1)' is oriented along the easy axis EAR(1)'. The free layer 68(1)' defines an easy axis EAF(1)' substantially orthogonal to the easy axis EAR(1)' and in-plane to the substrate 64. The easy axis EAF(1)' of the free layer 68(1)' in the MTJ 128(1) is also substantially orthogonal to the easy axis EAF(1) of the free layer 68(1) in the MTJ 40(1). The sense circuit 130(1) is configured to sense a resistance of the MTJ 128(1). Accordingly, the MTJ 128(1) is identical to the MTJ 128, and the sense circuit 130(1) is identical to the sense circuit 130 shown in FIG. 12.

The receiver cell 126(2) is configured to receive data from the transmitter cell 102(2) in the same manner described above with respect to the magnetic field-based contactless receiver 126 shown in FIG. 12 and the magnetic field-based contactless transmitter 102 shown in FIG. 11. Thus, the receiver cell 126(2) has an MTJ 40(2), a sense circuit 42(2), an MTJ 128(2), and a sense circuit 130(2). The MTJ 40(2) has a reference layer 66(2) and a free layer 68(2), wherein a tunneling barrier is defined between the reference layer 66(2) and the free layer 68(2). The MTJ 40(2) is disposed in-plane to the substrate 64. Furthermore, the reference layer 66(2) defines an easy axis EAR(2) in-plane to the substrate 64 such that a magnetization MR(2) of the reference layer 66(2) is oriented along the easy axis EAR(2). The free layer 68(2) defines an easy axis EAF(2) substantially orthogonal to the easy axis EAR(2) and in-plane to the substrate 64. The sense circuit 42(2) is configured to sense a resistance of the MTJ 40(2). Accordingly, the MTJ 40(2) is identical to the MTJ 40, and the sense circuit 42(2) is identical to the sense circuit 42 shown in FIG. 11. Additionally, the MTJ 128(2) has a reference layer 66(2)' and a free layer 68(2)', wherein a tunneling barrier is defined between the reference layer 66(2)' and the free layer 68(2)'. The MTJ 128(2) is disposed in-plane to the substrate 64. Furthermore, the reference layer 66(2)' defines an easy axis EAR(2)' in-plane to the substrate 64 such that a magnetization MR(2)' of the reference layer 66(2)' is oriented along the easy axis EAR(2)'. The free layer 68(2)' defines an easy axis EAF(2)' substantially orthogonal to the easy axis EAR(2)' and in-plane to the substrate 64. The easy axis EAF(2)' of the free layer 68(2)' in the MTJ 128(2) is also substantially orthogonal to the easy axis EAF(2) of the free layer 68(2) in the MTJ 40(2). The sense circuit 130(2) is configured to sense a resistance of the MTJ 128(2). Accordingly, the MTJ 128(2) is identical to the MTJ 128, and the sense circuit 130(2) is identical to the sense circuit 130 shown in FIG. 12.

The receiver cell 126(3) is configured to receive data from the transmitter cell 102(3) in the same manner described above with respect to the magnetic field-based contactless receiver 126 shown in FIG. 12 and the magnetic field-based contactless transmitter 102 shown in FIG. 11. Thus, the receiver cell 126(3) has an MTJ 40(3), a sense circuit 42(3), an MTJ 128(3), and a sense circuit 130(3). The MTJ 40(3) has a reference layer 66(3) and a free layer 68(3), wherein a tunneling barrier is defined between the reference layer 66(3) and the free layer 68(3). The MTJ 40(3) is disposed in-plane to the substrate 64. Furthermore, the reference layer 66(3) defines an easy axis EAR(3) in-plane to the substrate 64 such that a magnetization MR(3) of the reference layer 66(3) is oriented along the easy axis EAR(3). The free layer 68(3) defines an easy axis EAF(3) substantially orthogonal to the easy axis EAR(3) and in-plane to the substrate 64. The sense circuit 42(3) is configured to sense a resistance of the MTJ 40(3). Accordingly, the MTJ 40(3) is identical to the MTJ 40, and the sense circuit 42(3) is identical to the sense circuit 42 shown in FIG. 11. Additionally, the MTJ 128(3) has a reference layer 66(3)' and a free layer 68(3)' wherein a tunneling barrier is defined between the reference layer 66(3)' and the free layer 68(3)'. The MTJ 128(3) is disposed in-plane to the substrate 64. Furthermore, the reference layer 66(3)' defines an easy axis EAR(3)' in-plane to the substrate 64 such that a magnetization MR(3)' of the reference layer 66(3)' is oriented along the easy axis EAR(3)'. The free layer 68(3)' defines an easy axis EAF(3)' substantially orthogonal to the easy axis EAR(3)' and in-plane to the substrate 64. The easy axis EAF(3)' of the free layer 68(3)' in the MTJ 128(3) is also substantially orthogonal to the easy axis EAF(3) of the free layer 68(3) in the MTJ 40(3). The sense circuit 130(3) is configured to sense a resistance of the MTJ 128(3). Accordingly, the MTJ 128(3) is identical to the MTJ 128, and the sense circuit 130(3) is identical to the sense circuit 130 shown in FIG. 12.

The receiver cell 126(4) is configured to receive data from the transmitter cell 102(4) in the same manner described above with respect to the magnetic field-based contactless receiver 126 shown in FIG. 12 and the magnetic field-based contactless transmitter 102 shown in FIG. 11. Thus, the receiver cell 126(4) has an MTJ 40(4), a sense circuit 42(4), an MTJ 128(4), and a sense circuit 130(4). The MTJ 40(4) has a reference layer 66(4) and a free layer 68(4), wherein a tunneling barrier is defined between the reference layer 66(4) and the free layer 68(4). The MTJ 40(4) is disposed in-plane to the substrate 64. Furthermore, the reference layer 66(4) defines an easy axis EAR(4) in-plane to the substrate 64 such that a magnetization MR(4) of the reference layer 66(4) is oriented along the easy axis EAR(4). The free layer 68(4) defines an easy axis EAF(4) substantially orthogonal to the easy axis EAR(4) and in-plane to the substrate 64. The sense circuit 42(4) is configured to sense a resistance of the MTJ 40(4). Accordingly, the MTJ 40(4) is identical to the MTJ 40, and the sense circuit 42(4) is identical to the sense circuit 42 shown in FIG. 11. Additionally, the MTJ 128(4) has a reference layer 66(4)' and a free layer 68(4)', wherein a tunneling barrier is defined between the reference layer 66(4)' and the free layer 68(4)'. The MTJ 128(4) is disposed in-plane to the substrate 64. Furthermore, the reference layer 66(4)' defines an easy axis EAR(4)' in-plane to the substrate 64 such that a magnetization MR(4)' of the reference layer 66(4)' is oriented along the easy axis EAR(4)'. The free layer 68(4)' defines an easy axis EAF(4)' substantially orthogonal to the easy axis EAR(4)' and in-plane to the substrate 64. The easy axis EAF(4)' of the free layer 68(4)' in the MTJ 128(4) is also substantially orthogonal to the easy axis EAF(4) of the free layer 68(4) in the MTJ 40(4). The sense circuit 130(4) is configured to sense a resistance of the MTJ 128(4). Accordingly, the MTJ 128(4) is identical to the MTJ 128, and the sense circuit 130(4) is identical to the sense circuit 130 shown in FIG. 12.

Figure 15:
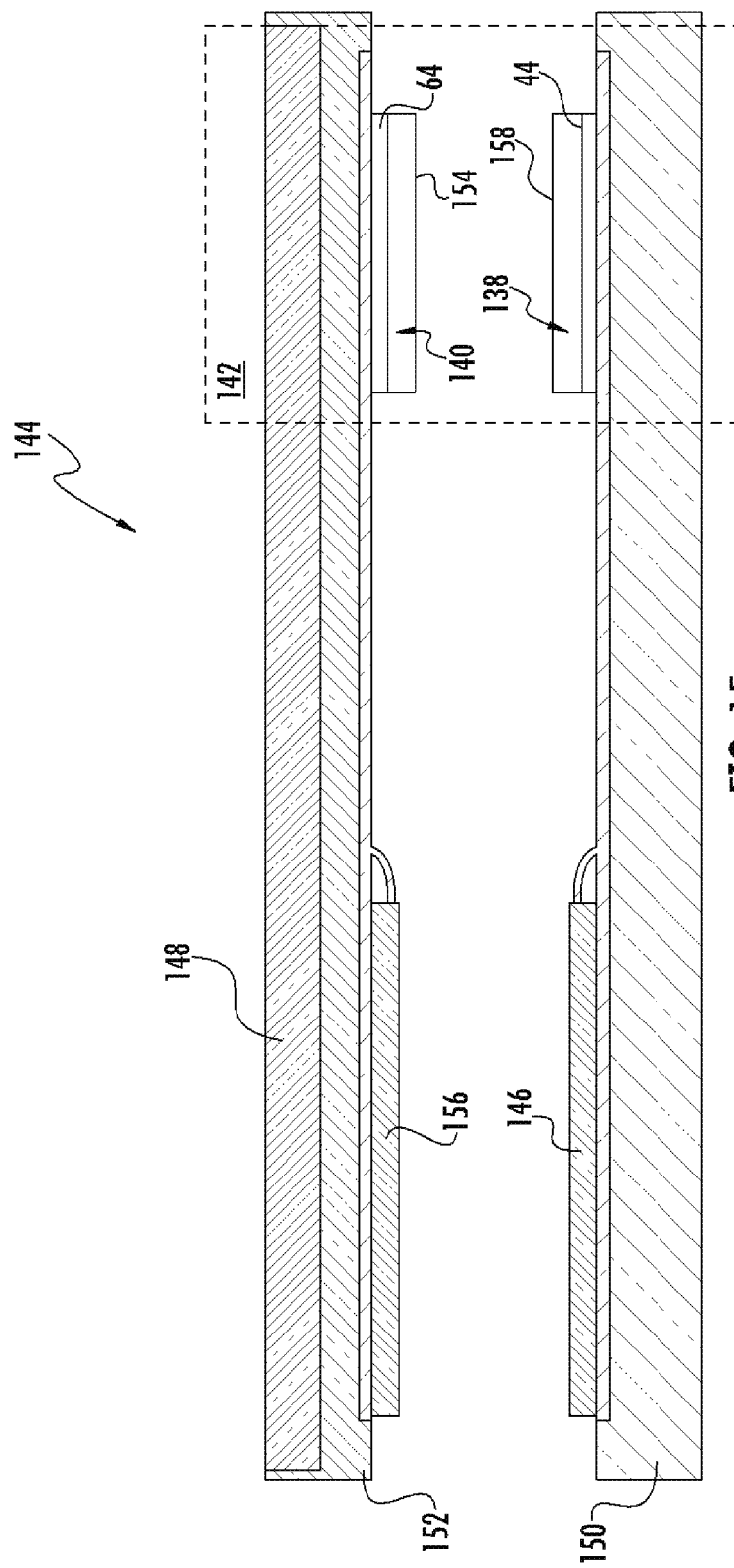
FIG. 15 illustrates an exemplary contactless communication device arranged in accordance with this disclosure and used in a portable electronic device in order to transfer data in a contactless manner between an application processor and a display in the portable electronic device.

FIG. 15 illustrates one embodiment of a contactless communication device 142 arranged in accordance with this disclosure. The contactless communication device 142 is used in a portable electronic device 144 in order to transfer data in a contactless manner between an application processor 146 and display(s) 148 in the portable electronic device 144. The portable electronic device 144 includes an application board 150 and a display board 152, each of which may be a printed circuit board. The application processor 146 is provided on the application board 150. The contactless communication device 142 also includes an IC package 154 provided on the application board 150. The IC package 154 is coupled to the application processor 146 by the application board 150. In this embodiment, the IC package 154 includes the substrate 44 and has the magnetic field-based contactless transmitter 138. The magnetic field-based contactless transmitter 138 is configured to communicate data provided by the application processor 146 in a contactless manner, as described above.

The display(s) 148 are provided on the display board 152 along with display controller(s) 156. The contactless communication device 142 also includes an IC package 158 provided on the display board 152. The IC package 158 is coupled to the display controller(s) 156 by the display board 152. In this embodiment, the IC package 158 includes the substrate 64 and has the magnetic field-based contactless receiver 140 shown in FIG. 14. The magnetic field-based contactless receiver 140 is configured to receive data in a contactless manner from the magnetic field-based contactless transmitter 138, as described above. The data is then transmitted by the magnetic field-based contactless receiver 140 to the display controller(s) 156 via the display board 152. In this manner, the application processor 146 is configured to communicate data to the display(s) 148 using the contactless communication device 142.

Figure 16:
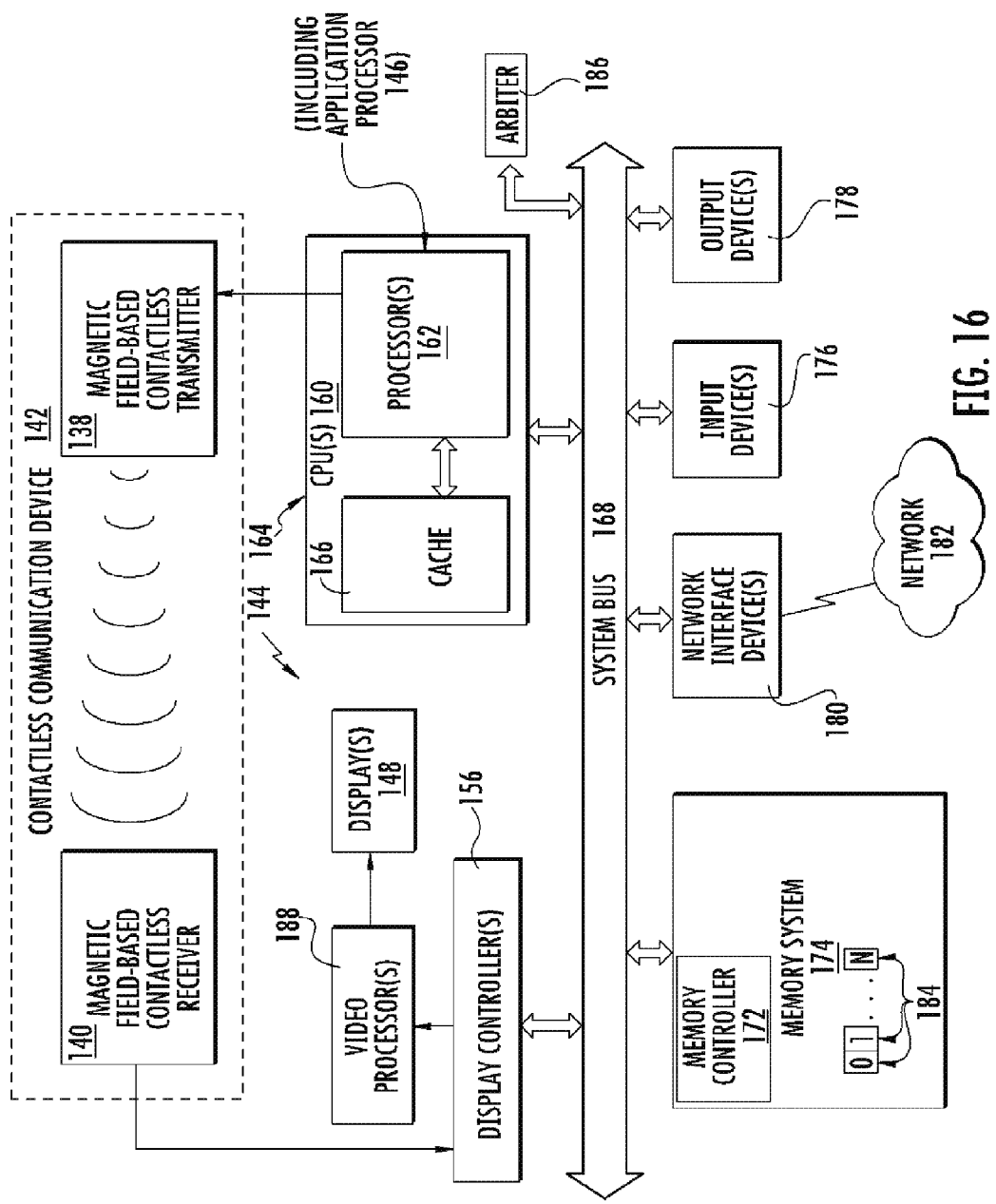
FIG. 16 is a block diagram of the portable electronic device shown in FIG. 15 that includes an exemplary processor-based system and a contactless communication device according to any of the embodiments disclosed herein that can be employed for contactless communication to a component in the processor-based system.

FIG. 16 is a block diagram of the portable electronic device 144 shown in FIG. 15 that includes an exemplary processor-based system and a contactless communication device according to any of the embodiments disclosed herein that can be employed for contactless communication to a component in the processor-based system. In this embodiment, the portable electronic device 144 shown in FIG. 15 includes the corresponding contactless communication device 142. Contactless data communication may be provided according to embodiments disclosed herein, and any embodiment of the contactless communication devices (such as the contactless communication device 142), the magnetic field-based contactless receivers (such as the magnetic field-based contactless receiver 140), and/or the magnetic field-based contactless transmitters (such as the magnetic field-based contactless transmitter 138) may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

In this regard, FIG. 16 illustrates an example of a processor-based system, which is the portable electronic device 144 that employs the contactless communication device 142 as illustrated in FIG. 15. In this example, the portable electronic device 144 includes one or more central processing units (CPUs) 160, each including one or more processors 162, such as the application processor 146. The CPU(s) 160 may be a master device 164. The CPU(s) 160 may have cache memory 166 coupled to the processor(s) 162 for rapid access to temporarily stored data. The CPU(s) 160 are coupled to a system bus 168 and can intercouple master and slave devices included in the portable electronic device 144. The system bus 168 may be a bus interconnect. As is well known, the CPU(s) 160 communicate with these other devices by exchanging address, control, and data information over the system bus 168. For example, the CPU(s) 160 can communicate bus transaction requests to a memory controller 172 as an example of a slave device. Although not illustrated in FIG. 16, multiple system buses 168 could be provided, wherein each system bus 168 constitutes a different fabric. Other master and slave devices can be connected to the system bus 168. As illustrated in FIG. 16, these devices can include a memory system 174, one or more input devices 176, one or more output devices 178, one or more network interface devices 180, and the display controller(s) 156, as examples. The input device(s) 176 can include any type of input device, including but not limited to input keys, switches, voice processors, etc. The output device(s) 178 can include any type of output device, including but not limited to audio, video, other visual indicators, etc. The network interface device(s) 180 can be any devices configured to allow exchange of data to and from a network 182. The network 182 can be any type of network, including but not limited to a wired or wireless network, private or public network, a local area network (LAN), a wide local area network (WLAN), and the Internet. The network interface device(s) 180 can be configured to support any type of communication protocol desired. The memory system 174 can include one or more memory units 184 (0-N). An arbiter 186 may be provided between the system bus 168 and master and slave devices coupled to the system bus 168, such as, for example, the memory units 184 (0-N) provided in the memory system 174.

In this embodiment, the CPU(s) 160 are configured to access the display controller(s) 156 using the contactless communication device 142 to control information sent to one or more displays 148. In this embodiment, the CPU(s) 160 may be coupled to the magnetic field-based contactless transmitter 138 of the contactless communication device 142. Accordingly, the magnetic field-based contactless transmitter 138 transmits information from the CPU(s) 160 in a contactless manner to the magnetic field-based contactless receiver 140. The display controller(s) 156 is configured to receive the information from the magnetic field-based contactless receiver 140. The display controller(s) 156 sends the information to the display(s) 148 to be displayed via one or more video processors 188, which process the information to be displayed into a format suitable for the display(s) 148. The display(s) 148 can include any type of display, including but not limited to a cathode ray tube (CRT), a liquid crystal display (LCD), a plasma display, etc.

The CPU(s) 160 and the display controller(s) 156 may act as master devices to make memory access requests to the arbiter 186 over the contactless communication device 142. Different threads within the CPU(s) 160 and the display controller(s) 156 may make requests to the arbiter 186. The CPU(s) 160 and the display controller(s) 156 may provide the MID to the arbiter 186 as part of a transaction request.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The arbiters, master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An in-plane magnetic field-based contactless receiver comprising:
   a substrate;
   a magnetic tunnel junction (MTJ) disposed in-plane to the substrate and having a resistance, the MTJ comprising:
      a reference layer defining a first easy axis in-plane to the substrate such that a first magnetization of the reference layer is oriented along the first easy axis; and
      a free layer defining a second easy axis substantially orthogonal to the first easy axis and in-plane to the substrate, wherein the free layer is configured such that a second magnetization of the free layer is switchable between being oriented in a first direction around the second easy axis to provide the resistance of the MTJ in a first resistive state and being oriented in a second direction around the second easy axis to provide the resistance of the MTJ in a second resistive state; and a sense circuit configured to sense the resistance of the MTJ, wherein the MTJ is configured to act as a contactless receiver in a communication system by changing between the first resistive state and the second resistive state to reflect changes in a logical state representing data, the changing a function of magnetic fields impinging upon the free layer such that:

a first logical value is imputed when a first one of a pair of antipodal magnetic dipoles impinges on the free layer by pointing out of the free layer and a second one of the pair of antipodal magnetic dipoles impinges on the free layer by pointing into the free layer; and a second logical value is imputed when the second one of the pair of antipodal magnetic dipoles impinges on the free layer by pointing out of the free layer and the first one of the pair of antipodal magnetic dipoles impinges on the free layer by pointing into the free layer.

2. The in-plane magnetic field-based contactless receiver of claim 1 wherein the sense circuit is configured to sense the resistance of the MTJ by generating a logic output having the logical state set in accordance with the resistance.

3. The in-plane magnetic field-based contactless receiver of claim 2 wherein the sense circuit is configured to generate the logic output such that the logical state has the first logical value in response to the resistance being in the first resistive state and such that the logical state has the second logical value in response to the resistance being in the second resistive state.

4. The in-plane magnetic field-based contactless receiver of claim 3 wherein:

the free layer is further configured such that the second magnetization is switchable to be oriented in a third direction substantially along the second easy axis to provide the resistance of the MTJ in a third resistive state; and the sense circuit is further configured to sense the resistance of the MTJ by generating the logic output such that the logical state has a third logical value in response to the resistance being in the third resistive state.

5. The in-plane magnetic field-based contactless receiver of claim 1 further comprising:

a second MTJ disposed in-plane to the substrate and having a second resistance, the second MTJ comprising:

a second reference layer defining a third easy axis in-plane to the substrate such that a third magnetization of the second reference layer is oriented along the third easy axis; and a second free layer defining a fourth easy axis substantially orthogonal to the third easy axis and in-plane to the substrate, wherein the second free layer is configured such that a fourth magnetization of the second free layer is switchable between being oriented in a third direction around the fourth easy axis to provide the second resistance of the second MTJ in the first resistive state and being oriented in a fourth direction around the fourth easy axis to provide the second resistance of the second MTJ in the second resistive state; and a second sense circuit configured to sense the second resistance of the second MTJ.

6. The in-plane magnetic field-based contactless receiver of claim 5 wherein the fourth easy axis is substantially orthogonal to the second easy axis.

7. The in-plane magnetic field-based contactless receiver of claim 5 wherein:

the sense circuit is configured to sense the resistance of the MTJ by generating a first logic output having the logical state that is set in accordance with the resistance; and the second sense circuit is configured to sense the second resistance of the second MTJ by generating a second logic output having the logical state that is set in accordance with the second resistance.

8. The in-plane magnetic field-based contactless receiver of claim 7 wherein:

the sense circuit is configured to generate the first logic output such that the logical state of the first logic output has a logical value in response to the resistance being in the first resistive state and such that the logical state of the first logic output has another logical value in response to the resistance being in the second resistive state; and the second sense circuit is configured to generate the second logic output such that the logical state of the second logic output has a logical value in response to the second resistance being in the first resistive state and such that the logical state of the second logic output has another logical value in response to the second resistance being in the second resistive state.

9. The in-plane magnetic field-based contactless receiver of claim 8 wherein:

the free layer is further configured such that the second magnetization is switchable to be oriented in a fifth direction substantially along the second easy axis to provide the resistance of the MTJ in a third resistive state;

the second free layer is further configured such that the fourth magnetization is switchable to be oriented in a sixth direction substantially along the fourth easy axis to provide the second resistance of the second MTJ in the third resistive state;

the sense circuit is further configured to sense the resistance of the MTJ by generating the first logic output such that the logical state of the first logic output has still another logical value in response to the resistance being in the third resistive state; and the second sense circuit is further configured to sense the second resistance of the second MTJ by generating the second logic output such that the logical state of the second logic output has still another logical value in response to the second resistance being in the third resistive state.

10. The in-plane magnetic field-based contactless receiver of claim 1, wherein the magnetic field-based contactless receiver is provided in an integrated circuit (IC) package.

11. The in-plane magnetic field-based contactless receiver of claim 1 integrated into a device selected from a group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

12. The in-plane magnetic field-based contactless receiver of claim 1 integrated into an integrated circuit (IC).

13. An in-plane contactless method of receiving data comprising:
providing a magnetic tunnel junction (MTJ) disposed in-plane to a substrate and having a resistance, wherein the MTJ comprises:
a reference layer defining a first easy axis in-plane to the substrate such that a first magnetization of the reference layer is oriented along the first easy axis; and
a free layer defining a second easy axis substantially orthogonal to the first easy axis and in-plane to the substrate;
orienting a second magnetization of the free layer such that the second magnetization is oriented in a first direction around the second easy axis to provide the resistance of the MTJ in a first resistive state, when a first one of a pair of antipodal magnetic dipoles impinges on the free layer by pointing out of the free layer and a second one of the pair of antipodal magnetic dipoles impinges on the free layer by pointing into the free layer;
orienting the second magnetization such that the second magnetization is oriented in a second direction around the second easy axis to provide the resistance of the MTJ in a second resistive state, when the second one of the pair of antipodal magnetic dipoles impinges on the free layer by pointing out of the free layer and the first one of the pair of antipodal magnetic dipoles impinges on the free layer by pointing into the free layer; and
sensing the resistance of the MTJ.

14. The in-plane contactless method of claim 13, wherein sensing the resistance of the MTJ comprises generating a logic output having a logical state set in accordance with the resistance.

15. The in-plane contactless method of claim 13, further comprising:
providing a second MTJ disposed in-plane to the substrate and having a second resistance, the second MTJ comprising:
a second reference layer defining a third easy axis in-plane to the substrate such that a third magnetization of the second reference layer is oriented along the third easy axis; and
a second free layer defining a fourth easy axis substantially orthogonal to the third easy axis and in-plane to the substrate, wherein the second free layer is configured such that a fourth magnetization of the second free layer is switchable between being oriented in a third direction around the fourth easy axis to provide the second resistance of the second MTJ in the first resistive state and being oriented in a fourth direction around the fourth easy axis to provide the second resistance of the second MTJ in the second resistive state; and
sensing the second resistance of the second MTJ.

16. A contactless communication device comprising:
a magnetic tunnel junction (MTJ) configured to operate as a receiver for a transmitter; and
the transmitter comprising:
a pair of coils configured to produce a pair of antipodal magnetic dipoles, wherein the pair of coils is disposed relative to the MTJ such that the pair of antipodal magnetic dipoles generates a magnetic field in-plane to the MTJ; and
a drive circuit configured to:
receive a logic input having a logical state;
drive the pair of coils to produce the pair of antipodal magnetic dipoles by setting a magnetic polarity of each of the pair of antipodal magnetic dipoles in accordance with the logical state of the logic input by:
providing one of the pair of antipodal magnetic dipoles so that the one of the pair of antipodal magnetic dipoles points out of a substrate with a first dipole coil and providing another one of the pair of antipodal magnetic dipoles so that the other one of the pair of antipodal magnetic dipoles points into the substrate with a second dipole coil in response to the logical state of the logic input having a first logical value; and
providing the one of the pair of antipodal magnetic dipoles so that the one of the pair of antipodal magnetic dipoles points out of the substrate with the second dipole coil and providing the other one of the pair of antipodal magnetic dipoles so that the other one of the pair of antipodal magnetic dipoles points into the substrate with the first dipole coil in response to the logical state of the logic input having a second logical value; and
adjust a magnetic field orientation of the magnetic field in-plane to the MTJ.

17. The contactless communication device of claim 16 further comprising a second substrate wherein the MTJ is disposed in-plane with the second substrate.

18. The contactless communication device of claim 16 wherein the MTJ comprises:
a reference layer; and
a free layer, wherein the MTJ is disposed such that the pair of antipodal magnetic dipoles generates the magnetic field in-plane to the free layer.

19. The contactless communication device of claim 18 wherein the drive circuit is configured to adjust the magnetic field orientation of the magnetic field in-plane to the free layer by switching the magnetic polarity of each of the pair of antipodal magnetic dipoles.

20. The contactless communication device of claim 19 wherein the drive circuit is configured to:
receive the logic input having the logical state;
drive the pair of coils to generate the pair of antipodal magnetic dipoles; and
set the magnetic polarity of each of the pair of antipodal magnetic dipoles in accordance with the logical state of the logic input.

21. The contactless communication device of claim 18 wherein the free layer is configured such that a second magnetization of the free layer is switchable in response to the drive circuit adjusting the magnetic field orientation of the magnetic field in-plane to the free layer.

22. The contactless communication device of claim 18 further comprising a second substrate wherein the MTJ is disposed in-plane to the second substrate and wherein:
the reference layer defines a first easy axis in-plane to the second substrate; and
the free layer defines a second easy axis substantially orthogonal to the first easy axis and in-plane to the second substrate, wherein the magnetic field is generated along the second easy axis.

23. The contactless communication device of claim 18 further comprising a second substrate wherein the MTJ is disposed in-plane to the second substrate and wherein:
- the reference layer defines a first easy axis in-plane to the second substrate and having a second magnetization fixed along the first easy axis; and
- the free layer defines a second easy axis substantially orthogonal to the first easy axis and in-plane to the second substrate, wherein the free layer has a third magnetization and the free layer is configured such that the free layer is switchable between being oriented in a first direction around the second easy axis to provide a resistance of the MTJ in a first resistive state and being oriented in a second direction around the second easy axis to provide the resistance of the MTJ in a second resistive state in response to adjusting the magnetic field orientation of the magnetic field in-plane to the free layer.

24. The contactless communication device of claim 18 wherein the drive circuit is configured to adjust the magnetic field orientation of the magnetic field in-plane to the free layer by switching the magnetic polarity of each of the pair of antipodal magnetic dipoles.

25. The contactless communication device of claim 16 further comprising a sense circuit configured to sense a resistance of the MTJ.

26. The contactless communication device of claim 16 further comprising:
- a second MTJ;
- a second pair of coils configured to produce a second pair of antipodal magnetic dipoles, wherein the second pair of coils is disposed relative to the second MTJ such that the second pair of antipodal magnetic dipoles generates a second magnetic field in-plane to the second MTJ; and
- a second drive circuit configured to:
  - drive the second pair of coils to produce the second pair of antipodal magnetic dipoles; and
  - adjust a magnetic field orientation of the second magnetic field in-plane to the second MTJ.

27. The contactless communication device of claim 26 wherein the magnetic field generated by the pair of antipodal magnetic dipoles is substantially orthogonal to the second magnetic field generated by the second pair of antipodal magnetic dipoles.

28. The contactless communication device of claim 26 further comprising a second substrate wherein the MTJ and the second MTJ are disposed in-plane to the second substrate and wherein:
- the MTJ comprises:
  - a reference layer; and
  - a free layer defining a first easy axis in-plane to the second substrate, wherein the MTJ is disposed such that the magnetic field generated by the pair of antipodal magnetic dipoles is generated in-plane to the free layer; and
- the second MTJ comprises:
  - a second reference layer; and
  - a second free layer defining a second easy axis in-plane to the second substrate that is substantially orthogonal to the first easy axis of the free layer, wherein the second MTJ is disposed such that the second magnetic field generated by the second pair of antipodal magnetic dipoles is generated in-plane to the second free layer.

29. The contactless communication device of claim 16 is provided in an integrated circuit (IC) package.

30. The contactless communication device of claim 16 integrated into a device selected from a group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

31. The contactless communication device of claim 16 integrated into an integrated circuit (IC).

32. A method of contactless data communication comprising:
- providing a magnetic tunnel junction (MTJ) disposed in-plane to a substrate that acts as a receiver in a contactless data communication system;
- receiving a logic input having a logical state; and
- producing a pair of antipodal magnetic dipoles such that the pair of antipodal magnetic dipoles generates a magnetic field in-plane to the MTJ; and
- adjusting a magnetic field orientation of the magnetic field by setting a magnetic polarity of each of the pair of antipodal magnetic dipoles in accordance with the logical state of the logic input by:
  - providing one of the pair of antipodal magnetic dipoles so that the one of the pair of antipodal magnetic dipoles points out of the substrate with a first dipole coil and providing another one of the pair of antipodal magnetic dipoles so that the other one of the pair of antipodal magnetic dipoles points into the substrate with a second dipole coil in response to the logical state of the logic input having a first logical value; and
  - providing the one of the pair of antipodal magnetic dipoles so that the one of the pair of antipodal magnetic dipoles points out of the substrate with the second dipole coil and providing the other one of the pair of antipodal magnetic dipoles so that the other one of the pair of antipodal magnetic dipoles points into the substrate with the first dipole coil in response to the logical state of the logic input having a second logical value.

* * * * *